United States Patent
Utsumi

(10) Patent No.: US 10,718,792 B2
(45) Date of Patent: Jul. 21, 2020

(54) MULTIFUNCTIONAL SUBSTRATE INSPECTION APPARATUS AND MULTIFUNCTIONAL SUBSTRATE INSPECTION METHOD

(71) Applicant: WIT CO., LTD., Nagareyama-shi, Chiba (JP)

(72) Inventor: Masato Utsumi, Nagareyama (JP)

(73) Assignee: WIT CO., LTD., Nagareyama (JP)

( * ) Notice: Subject to any disclaimer, the term of this patent is extended or adjusted under 35 U.S.C. 154(b) by 120 days.

(21) Appl. No.: 16/099,895

(22) PCT Filed: Mar. 21, 2017

(86) PCT No.: PCT/JP2017/011278
§ 371 (c)(1),
(2) Date: Nov. 8, 2018

(87) PCT Pub. No.: WO2017/195470
PCT Pub. Date: Nov. 16, 2017

(65) Prior Publication Data
US 2019/0162756 A1 May 30, 2019

(30) Foreign Application Priority Data
May 11, 2016 (WO) .................. PCT/JP2016/064033

(51) Int. Cl.
*G01R 1/073* (2006.01)
*G01R 31/28* (2006.01)
*G01R 31/50* (2020.01)

(52) U.S. Cl.
CPC ......... *G01R 1/07364* (2013.01); *G01R 31/28* (2013.01); *G01R 31/2831* (2013.01); *G01R 31/50* (2020.01)

(58) Field of Classification Search
USPC ............ 324/754.13, 754.14, 754.03, 754.08, 324/756.04
See application file for complete search history.

(56) References Cited

U.S. PATENT DOCUMENTS

| 4,841,241 A | 6/1989 | Hilz et al. | |
|---|---|---|---|
| 6,025,729 A * | 2/2000 | Van Loan | G01R 1/07328 324/750.25 |
| 2008/0054919 A1 * | 3/2008 | Wu | G01R 1/07357 324/756.04 |

FOREIGN PATENT DOCUMENTS

| JP | H01-184480 A | 7/1989 |
|---|---|---|
| JP | H04-064784 A | 2/1992 |

(Continued)

OTHER PUBLICATIONS

Jun. 20, 2017 Search Report issued in International Patent Application No. PCT/JP2017/011278.

*Primary Examiner* — Vincent Q Nguyen
(74) *Attorney, Agent, or Firm* — Oliff PLC

(57) ABSTRACT

Provided is a multifunctional substrate inspection apparatus capable of selectively bringing probes into contact. The apparatus is provided with first and second probe bases 100, 200 to which probes 111-217 having different lengths and capable of contacting surfaces 10, 20 of a substrate 30, driving device 50 increasing and decreasing an interval between the first and second probe base 100, 200, an intermediate plate 300 capable of carrying the substrate 30 between the first and second probe bases 100, 200, a first extendable pole or equivalent support mechanism attached to the first probe base 100 and capable of pressing the substrate 30 with a biasing force F1 based on a driving force F of the driving device 50 transmitted via first biasing device 61, second biasing device 42 for urging the substrate 30 to be inspected away from the intermediate plate 300, and third (Continued)

biasing device 43 for urging the intermediate plate 300 away from the second probe base 200, the probes 111-217 being selectively brought into contact with the substrate 30 according to their different lengths.

11 Claims, 13 Drawing Sheets

(56) References Cited

FOREIGN PATENT DOCUMENTS

| | | |
|---|---|---|
| JP | H04-64784 U | 6/1992 |
| JP | H05-050368 A | 3/1993 |
| JP | H05-50368 U | 7/1993 |
| JP | H09-138257 A | 5/1997 |
| JP | 2003-050256 A | 2/2003 |
| JP | 2012-103184 A | 5/2012 |

* cited by examiner

MULTIFUNCTIONAL SUBSTRATE INSPECTION APPARATUS AND MULTIFUNCTIONAL SUBSTRATE INSPECTION METHOD

This application claims priority to International Application No. PCT/JP2016/064033 filed on May 11, 2016, the entire contents of which are hereby incorporated by reference.

TECHNICAL FIELD

The present disclosure relates to a multifunctional substrate inspection apparatus and a multifunctional substrate inspection method and more particularly relates to a multifunctional substrate inspection apparatus and multifunctional substrate inspection method in which a variety of inspections are performed in multiple stages.

BACKGROUND ART

Typical printed circuit board inspection devices perform only DC open/short inspections of the status of board wiring without determining whether degree of coupling meets specifications. Moreover, these devices have been unable to determine whether responses of a digital semiconductor element having a hysteresis input circuit against RZ signals meet a defined rage.

Thus, to inspect a printed circuit board constituting a bus using a directional coupler and a semiconductor element, printed circuit board inspection devices are known which use TDR (Time Domain Reflectometry) methods to inspect whether the degree of coupling is within specified values and to inspect whether responses to voltage and pulse-width times of polar RZ signals are within specified values (for example, refer to PLT 1). TDR methods are common as impedance measurement methods such as for transmission lines as well as printed circuit boards and are suitable for measuring impedance characteristics such as in cables including interface cables used to transmit data signals such as clock pulses.

However, the printed circuit board inspection device described in PLT 1 is not a multifunctional substrate inspection apparatus capable of performing multiple types of inspections on both sides of a substrate in multiple stages by selectively bringing only respectively required probes into contact with one of the both sides of a substrate.

Furthermore, circuit board inspection jigs with high degrees of freedom for positioning and insertion direction of a camera for fine adjustment of relative positioning of a circuit board under inspection and the jig while saving space for storing the jig are also known (for example, see PLT 2).

This circuit board inspection jig has a custom jig portion corresponding to specifications of the circuit board under inspection and a common jig portion which is commonly used; the custom jig portion includes a probe holding board holding probes in positions corresponding to each test point of the circuit board under inspection and which brings each of the probes into contact with each of the test points, conductors in contact with one end of each probe of the probe holding board, and a test point collecting board connected with the other end of the conductors, and the common jig portion has a probe block holding probes in contact with the other end of each of the conductors of the test point collecting board and a connector connection board in contact with probes of the probe block to determine the conduction status of each inspection contact on the circuit board to be inspected via the connector connection board.

However, the circuit board inspection jig described in PLT 2 is not a multifunctional substrate inspection apparatus capable of performing multiple types of inspections on both sides of a substrate in multiple stages by selectively bringing only respectively required probes into contact with one of the both sides of a substrate.

CITATION LIST

Patent Literature

PLT 1: Japanese Unexamined Patent Application Publication No. 2003-50256
PLT 2: Japanese Unexamined Patent Application Publication No. 2012-103184

SUMMARY OF INVENTION

Technical Problem

In view of the foregoing, an object of the present disclosure is to provide a multifunctional substrate inspection apparatus and multifunctional substrate inspection method capable of performing multiple types of inspections on both sides of a substrate in multiple stages by selectively bringing only respectively required probes into contact with one of the both sides of a substrate.

Solution to Problem

The present disclosure is directed to attaining such an object, and a first aspect of the present disclosure is a multifunctional substrate inspection apparatus (500) configured to select probes (111-114, 211-217) according to switching of inspection functions and bring the selected probes into contact with a substrate (30) to be inspected and includes a first probe base (100) to which probes (111-114) having different lengths and capable of being brought into contact with a first surface (10) of the substrate (30) to be inspected are attached; a second probe base (200) to which probes (211-217) having different lengths and capable of being brought into contact with a second surface (20) of the substrate (30) to be inspected are attached; an intermediate plate (300) located between the first probe base (100) and the second probe base (200) and capable of carrying the substrate (30) to be inspected; driving means (50) for generating a driving force (F) which changes a separation distance (L1-L3) between the first probe base (100) and the second probe base (200); a first extendable pole (60, 90) or equivalent extendable support mechanism (60) attached to the first probe base (100) and capable of pressing the first surface (10) of the substrate (30) to be inspected with a biasing force (F1) of the driving force (50) transmitted via first biasing means (61); second biasing means (42) for urging the substrate (30) to be inspected away from the intermediate plate (300); a second pole (44) regulating an operation of decreasing or increasing distance between the intermediate plate (300) and the substrate (30) to be inspected within a predetermined range while maintaining parallelism between facing surfaces of the intermediate plate (300) and the substrate (30) to be inspected; third biasing means (43) for urging the intermediate plate (300) away from the second probe base (200); a third pole (41) regulating an operation of decreasing or increasing distance between the intermediate plate (300) and the second probe base (200) within a predetermined range while maintaining parallelism between facing surfaces of the intermediate plate (300) and the substrate (200) to be inspected; a control unit (70) causing the driving means (50) to generate the driving force (F) in multiple stages capable of resisting a biasing force (H) of the second biasing means (42) and the third biasing means (43); and an inspection circuit (80) capable of switching the inspection functions in accordance with the control unit (70), the probes (111-114, 211-217) being selectively brought into contact according to length.

A second aspect of the present disclosure is the multifunctional substrate inspection apparatus (500, 501) according to the first aspect, in which a relation among a spring constant K1 of the first biasing means (61), a spring constant K2 of the second biasing means (42), and a spring constant K3 of the third biasing means (43) is K2<K1<K3.

A third aspect of the present disclosure is the multifunctional substrate inspection apparatus (500, 501) according to the second aspect, in which the inspection functions of the inspection circuit (80) are any two or more of a boundary scan test, an in-circuit test, and a functional test.

A fourth aspect of the present disclosure is the multifunctional substrate inspection apparatus (500, 501) according the third aspect, in which the separation distance (L1-L3) can be differentiated into three levels of maximum (L1), minimum (L2), and intermediate (L3) by a relation of force magnitudes between the biasing force (H) of the second biasing means (42) together with the third biasing means (43) and the biasing force (F1) of the driving force (F) together with the first extendable pole (60, 90) or equivalent extendable support mechanism (60), opening the separation distance (L1-L3) to maximum (L1) enables replacement of the substrate (30) to be inspected, closing the separation distance (L1-L3) to minimum (L2) and bringing all of the probes (111-114, 211-217) into contact with the substrate (30) to be inspected (30) which is sandwiched corresponds with an in-circuit test function, and holding the separation distance (L1-L3) at intermediate (L3) and bringing only long probes (111, 211, 212) differentiated by length into contact with the substrate (30) to be inspected corresponds with a boundary scan test or functional test function.

A fifth aspect of the present disclosure is the multifunctional substrate inspection apparatus (500, 501) according to any one of the first to fourth aspects in which the first pole (60, 90) has a telescoping structure in which the first biasing means (61) interposes between a sleeve member (62, 92) and a rod member (63, 93).

A sixth aspect of the present disclosure is the multifunctional substrate inspection apparatus (501) according to any one of the first to fourth aspects which further includes a pressing plate (400) through which through holes (1-4) are opened to allow the probes (111-114) attached to the first probe base (100) to penetrate, the pressing plate being located between the first probe base (100) and the substrate (30) to be inspected, secured to a tip portion of the first pole (60) or equivalent extendable support mechanism (60), and separable from the first probe base (100) while maintaining parallelism with the first probe base (100), the multifunctional substrate inspection apparatus (501) being capable of elastically pressing a surface of the substrate (30) to be inspected with the pressing plate (400).

A seventh aspect of the present disclosure is a multifunctional substrate inspection method in which electrical inspection is performed while bringing probes (111-114) having different lengths and capable of being brought into contact with a first surface (10) of a substrate (30) to be inspected attached to a first probe base (100) and probes (211-217) having different lengths and capable of being brought into contact with a second surface (20) of the substrate (30) to be inspected attached to a second probe base (200) into contact with the substrate (300) to be inspected corresponding with an inspection step (S300) includes a standby step (S100) in which a control unit (70) drives to open a separation distance (L1-L3) between the first probe base (100) and the second probe base (200) to maximum (L1) via driving means (50) and standing by; a substrate placement step (S200) of placing the substrate (30) to be inspected onto an intermediate plate (300) located between the first probe base (100) and the second probe base (200); a substrate inspection step (S300) in which inspection functions of an inspection circuit (80) are switched and sequentially performed while the control unit (70) uses the driving means (50) to increase and decrease the separation distance (L1-L3) to multiple levels with a driving force (F) resisted by a biasing force (H) of a second biasing means (42) urging the substrate (30) to be inspected away from the intermediate plate (300) and a third biasing means (43) urging the intermediate plate (300) away from the second probe base (200); and a substrate removal step (S400) in which the control unit (70) drives to open the separation distance (L1-L3) to maximum (L1) via the driving means (50) and the substrate (30) to be inspected which has completed inspection is removed, in which, in the substrate inspection step (S300), by a first extendable pole (60, 90) or equivalent extendable support mechanism (60) attached to the first probe base (100) pressing on a first surface (10) of the substrate (30) to be inspected via a biasing force (F1) of a first biasing means (61) based on the driving force (F), the substrate (30) to be inspected approaches the intermediate plate (300) and the intermediate plate (300) approaches the second probe base (200) in a reversible stroke operation during which the probes (111-114, 211-217) are selectively brought into contact according to length.

An eight aspect of the present disclosure is the multifunctional substrate inspection method according to the seventh aspect, in which the substrate inspection step (S300) is a combination of two or more of an in-circuit test step (S310), a boundary scan test step (S320), and a functional test step (S330).

A ninth aspect of the present disclosure is the multifunctional substrate inspection method according to the eight aspect, in which the substrate inspection method (S300) includes a probe approach start step (S301) of pressing down on the first probe base (100) with the driving force (F) of the driving means (50); a substrate descending step (S302) of pressing down on the substrate (30) to be inspected with the first pole (60, 90) or equivalent extendable support mechanism (60) with a biasing force (F1) of the first biasing means (61) overcoming the second biasing means (42); a first (upper side) probe group selective contact step (S303) of bringing long probes (111, 211, 212) of probes differentiated by being long or short of the first probe base (100) into contact with the substrate (30) to be inspected; a descending substrate contact step (S304) in which the second surface (20) (lower side) of the substrate (30) to be inspected is brought into contact with spacers (301) of the intermediate plate (300); a second (lower side) probe group selective contact step (S305) of bringing long probes (211, 212) of probes differentiated by being long or short of the second probe base (200) into contact with the substrate (30) to be inspected; a first (upper side) probe group complete contact step (S306) in which the first pole (60, 90) or equivalent extendable support mechanism (60) retracts to minimum length by the driving force (F) of the driving means (50)

overcoming the biasing force of the first biasing means (61) and all of the long and short probes (111-114) of the first probe base (100) are brought into contact with the substrate (30) to be inspected; a second (lower side) probe group complete contact step (S307) in which the substrate (30) to be inspected and the intermediate plate (300) further descend due to the driving force (F) of the driving means (50) overcoming the biasing force of the third biasing means (43) and all of the long and short probes (211-217) of the second probe base (200) are brought into contact with the substrate (30) to be inspected; an in-circuit test step (S310); a first (upper side) probe group selective removal step (S311) of separating short probes (113-114) of probes differentiated by being long or short of the first probe base (100) from the substrate (30) to be inspected; a second (lower) probe group selective removal step (S312) of separating short probes (213-217) of probes differentiated by being long or short of the second probe base (200) from the substrate (30) to be inspected; the boundary scan test step (S320) or the functional test step (S330) which is performed with only long probes (111, 211, 212) remaining after reducing a number of contacts relative to the in-circuit test step (S310); and a complete probe separation step (S331) of lifting the first probe base (100) with the driving means (50).

A tenth aspect of the present disclosure is the multifunctional substrate inspection method according to any one of the seventh to ninth aspect, in which the separation distance (L1-L3) can be differentiated into three stages of maximum (L1), minimum (L2), and intermediate (L3), in the standby step (S100), the substrate placement step (S200), and the substrate removal step (S400), the separation distance (L1-L3) is opened to maximum (L1) and the substrate (30) to be inspected is replaceable, in the in-circuit test step (S310), the separation distance (L1-L3) is closed to minimum (L2) and all of the probes (111-114, 211-217) are brought into contact with the substrate (30) to be inspected which is sandwiched, and in the boundary scan test step (S320) or the functional test step (S330), the separation distance (L1-L3) is held at intermediate (L3) and only the long probes (111, 211, 212) are brought into contact with the substrate (30) to be inspected.

An eleventh aspect of the present disclosure is the multifunctional substrate inspection method according to the tenth aspect, in which the first pole (60, 90) is elastically extendable and incorporates a first biasing means (61) having a biasing force (F1) which extends a telescoping structure when the separation distance (L1-L3) is at maximum (L1) or intermediate (L3), the biasing force (F1) of the first biasing means (61) resisting retraction of the telescoping structure when the separation distance (L1-L3) is at minimum (L2).

Advantageous Effects of Invention

The present disclosure provides a multifunctional substrate inspection apparatus and a multifunctional substrate inspection method capable of performing multiple types of inspections on both sides of a substrate in multiple stages by selectively bringing only respectively required probes into contact with one of the both sides of a substrate.

BRIEF DESCRIPTION OF DRAWINGS

FIG. 5A illustrates a configuration having stepped portions in two locations to regulate advance/retreat of a core rod, and FIG. 5B illustrates a configuration having a stepped portion in one location to regulate advance/retreat of a core rod.

DESCRIPTION OF EMBODIMENTS

Figure 1:
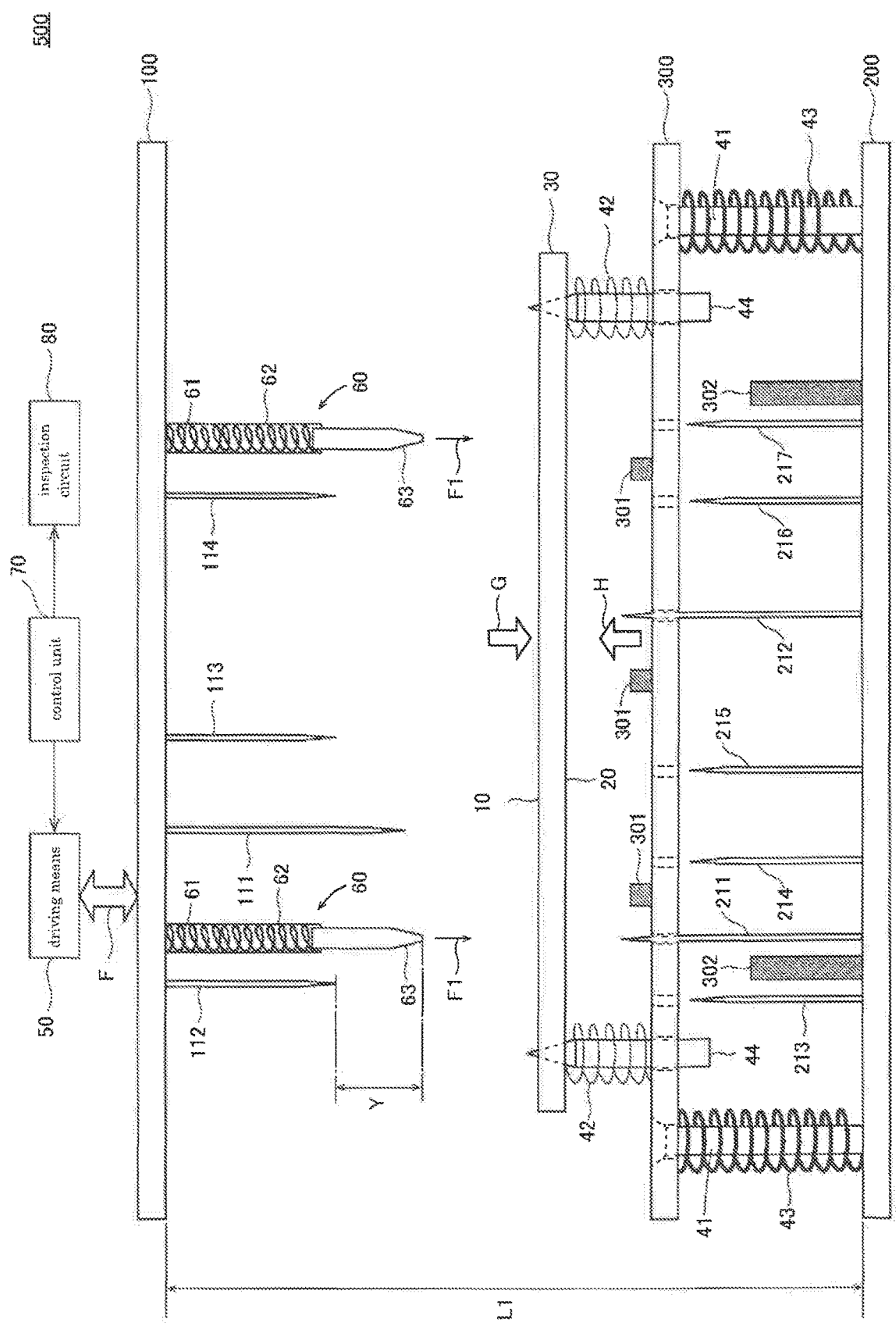
FIG. 1 is a front view illustrating a state in which a first probe base and a second probe base of a multifunctional substrate inspection apparatus (hereinafter also referred to as "the present apparatus") according to the present disclosure are at maximum separation from each other and a substrate to be inspected (hereinafter also referred to as "the mounting substrate" or "the substrate") is carried on an intermediate plate positioned between the first and second probe bases.

Hereinafter, the present apparatus and the present method will be explained in detail with reference to the accompanying drawings. It should be noted that, in the drawings, the same reference signs are assigned to members and steps having the same effect and the description thereof will not be repeated. Moreover, various inspection functions employed in the present apparatus are combinable in a variety of ways according to need. For example, to perform a composite inspection for one type of substrate, it is possible to arbitrarily combine three processes of an in-circuit test, a boundary scan test, and a functional test.

The in-circuit test is an inspection for finding defects, primarily in analog components, and is performed by bringing all of the probes into contact with the substrate. On the other hand, the boundary scan test is an inspection for finding individual component defects or unit-level defects in digital components mounted on the substrate. This boundary scan test is prone to adverse effects such as from unwanted radiation due to operation at high clock frequencies of several GHz. Thus, it is preferable to disconnect the substrate with probes and their connected wiring, which receive adverse effects such as from unwanted radiation. This can improve inspection result accuracy.

The functional test is an inspection for testing product functionality at the board level and, besides supplying power, it is for the most part sufficient to bring input/output probes into contact with the substrate. This functional test can be performed by bringing probes selected as appropriate into contact with the substrate. Such means for selectively bringing only required probes into contact with the substrate can be called a "jig for selective probe contact/separation according to multistage operation" or "two-step drawing jig" and also abbreviated hereinafter to "the present jig." Hereinafter, the present apparatus having a combination of the present jig which is semi-automated with a simplified structure and a multifunction inspection circuit will be described.

FIG. 1 is a front view illustrating a state in which a first probe base and a second probe base of the present apparatus are at maximum separation and a substrate is carried on an intermediate plate positioned between the first and second probe bases. As illustrated in FIG. 1, the present apparatus 500 includes a first probe base 100 and a second probe base 200 in a configuration in which both are held at a maximum separation distance L1 (a state hereinafter also referred to as "separated state") and also includes an intermediate plate 300, a first pole 60, first biasing means (hereinafter also referred to as "coil spring" or "spring") 61, a second pole 44, second biasing means (hereinafter also referred to as "coil spring" or "spring") 42, a third pole 41, spacers 301, 302, third biasing means (hereinafter also referred to as "coil spring" or "spring") 43, driving means 50, a control unit 70, and a multifunctional inspection circuit (hereinafter also referred to as "inspection circuit") 80.

Probes 111-114 having different lengths and capable of being brought into contact with a first surface (hereinafter also referred to as "upper surface") 10 of a substrate 30 are partly inserted in and vertically attached to the first probe base 100. Probes 211-217 having different lengths and capable of being brought into contact with a second surface (hereinafter also referred to as "lower surface") 20 of the substrate 30 are partly inserted in and vertically attached to the second probe base 200. Furthermore, a plurality of spacers 302 are disposed approximately evenly on an upper surface of the second probe base 200; when the intermediate plate 300 approaches in descent, the spacers 302 butt against and support the intermediate plate 300 so as to regulate the height of the intermediate plate 300.

The intermediate plate 300 is positioned between the first probe base 100 and second probe base 200 so as to maintain a mutually parallel relation and configured to be able to carry the substrate 30. A plurality of spacers 301 are disposed approximately evenly on an upper surface of the intermediate plate 300; when approaching in descent, the substrate 30 butts against the spacers 301 and is supported at a regulated height.

The first pole 60 is vertically attached to the first probe base 100 in parallel with the probes 111-114. Furthermore, the first pole 60 is in a telescoping configuration and internally incorporates a coil spring 61. The first pole 60 is provided with a biasing force (hereinafter also referred to as "elastic force") by this spring 61 pushing a rod member 63 in a direction out from a sleeve member 62. The label Y in FIG. 1 represents a difference in length from the first probe base 100 (upper side) between short probes 112-114 and the first pole 60. This difference Y in length will be explained below with reference to FIG. 8.

When pressing the first pole 60 with a driving force F from a base portion in the direction toward the tip, it is possible to flexibly press the first surface (upper surface) 10 of the substrate 30 by the extendable/retractable tip portion with a pressing force F1 accompanying the elastic force of the spring 61. A pressing force H (FIGS. 1, 2, 3, and 8) is a total pressing force of elastic forces of the spring 42 and the spring 43 combined with force from any of the probes 211-217 of the second probe base 200 (lower side) butting against the lower surface 20 of the substrate 30 and pressing upwards. As will be described below, because the spring 43 is considerably stiffer than the spring 42, it may be assumed that the spring 43 does not compress during extending/compressing operation of the spring 42. The control unit 70 causes the driving means 50 to generate a multistage driving force F capable of resisting the pressing force H. The driving means 50 may be constituted by an air cylinder and, by generating the driving force F at an appropriate strength, changes the separation distance L1-L3 between the first probe base 100 and second probe base 200.

The second pole 44 regulates an operation of decreasing or increasing distance between the intermediate plate 300 and the substrate 30 within a predetermined range while maintaining parallelism between facing surfaces thereof. Furthermore, a conical stylus portion is formed on the tip of the second pole 44 which functions as a positioning boss. Meanwhile, a guide hole (not illustrated in detail) conforming to sides of the style portion is opened in the substrate 30 to allow positioning. The coil spring 42 is engaged so that the coil is loosely wound around the second pole 44 and has an elastic force urging the substrate 30 away from the intermediate plate 300. Thus configured, the substrate 30 is elastically suspended above the intermediate plate 300.

The third pole 41 is vertically attached to the second probe base 200, has a head portion resembling that of a flathead screw, and slidably supports the intermediate plate 300 below this head portion. This third pole 41 regulates an operation of decreasing or increasing distance between the intermediate plate 300 and the second probe base 200 within a predetermined range while maintaining parallelism between mutual facing surfaces. The coil spring 43 is loosely wound in a coil around the third pole 41 and has an elastic force urging the intermediate plate 300 away from the second probe base 200. Thus configured, the intermediate plate 300 is elastically suspended above the second probe base 200.

Furthermore, the control unit 70 can switch inspection functions of the inspection circuit 80. The inspection functions of the inspection circuit 80 are any two or more of the boundary scan test, the in-circuit test, and the functional test. It should be noted that all of the probes 111-114, 211-217 are elastically extendable/retractable, as will be explained below with reference to FIGS. 4 and 5, and electrically connected to the inspection circuit 80 via wires not illustrated in the drawings. These wires are omitted from FIGS. 1, 3, and 8 for clarity.

Figure 2:
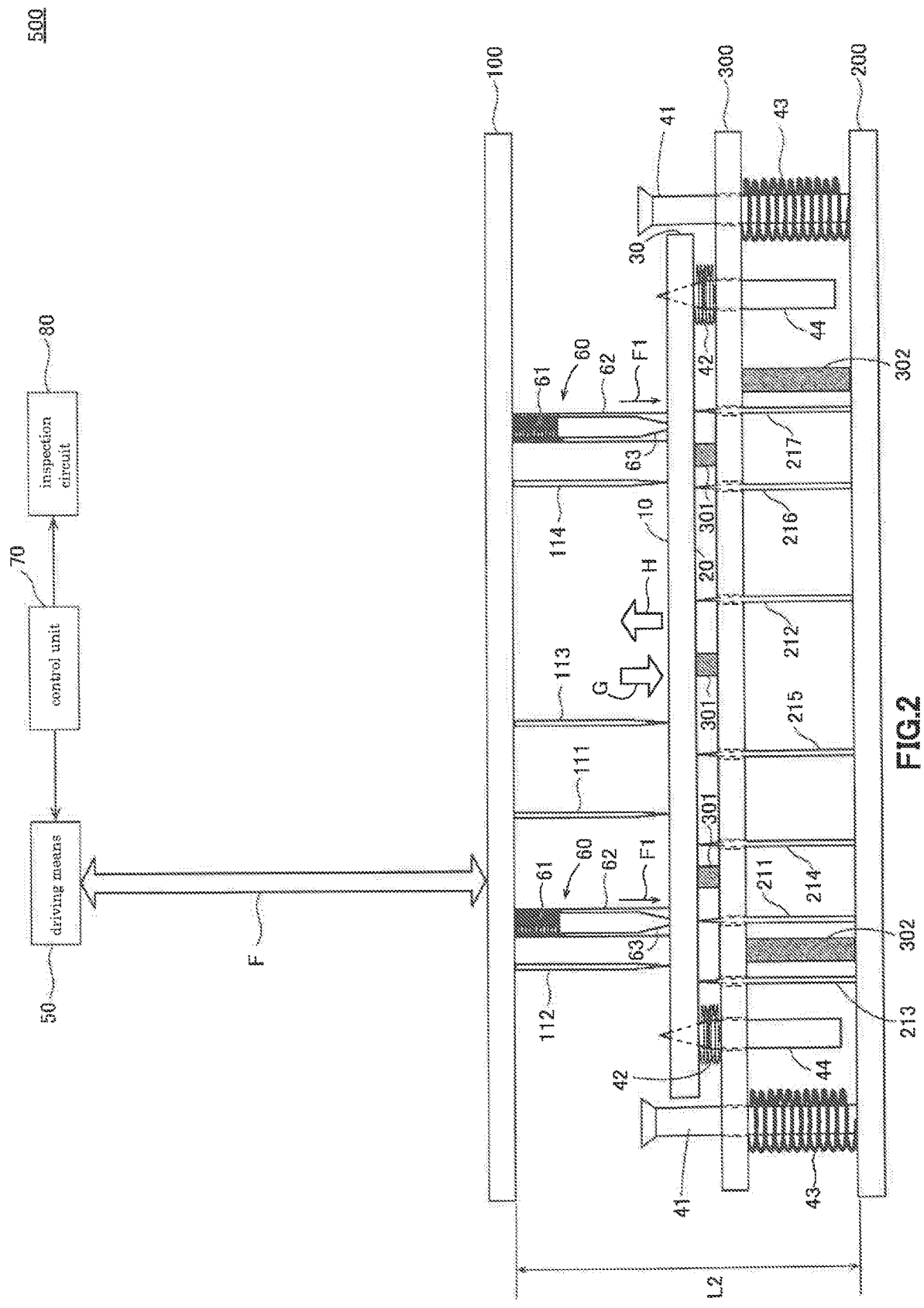
FIG. 2 is a front view illustrating the present apparatus in which the first probe base and the second probe base are held at maximum proximity and all of the probes, both long and short types, are brought into contact with the sandwiched substrate in an in-circuit test mode.

FIG. 2 is a front view illustrating the present apparatus in which the first probe base and the second probe base are held at maximum proximity and all of the probes, both long and short types, are brought into contact with the sandwiched substrate in an in-circuit test mode. The in-circuit test is an inspection for finding individual component defects or unit-level defects in analog components mounted on the substrate 30. As illustrated in FIG. 2, height of the lowered position of the intermediate plate 300 is regulated by a plurality of spacers 302 disposed approximately evenly on the upper surface of the second probe base 200. Likewise, height of the lowered position of the substrate 30 is regulated by a plurality of spacers 301 disposed approximately evenly on the upper surface of the intermediate plate 300. In the state (hereinafter also referred to as "closed state") illustrated in FIG. 2, all of the probes 111-114, 211-217 are brought into contact with the upper surface 10 and lower surface 20 of the substrate 30 and the in-circuit test is performed.

Figure 3:
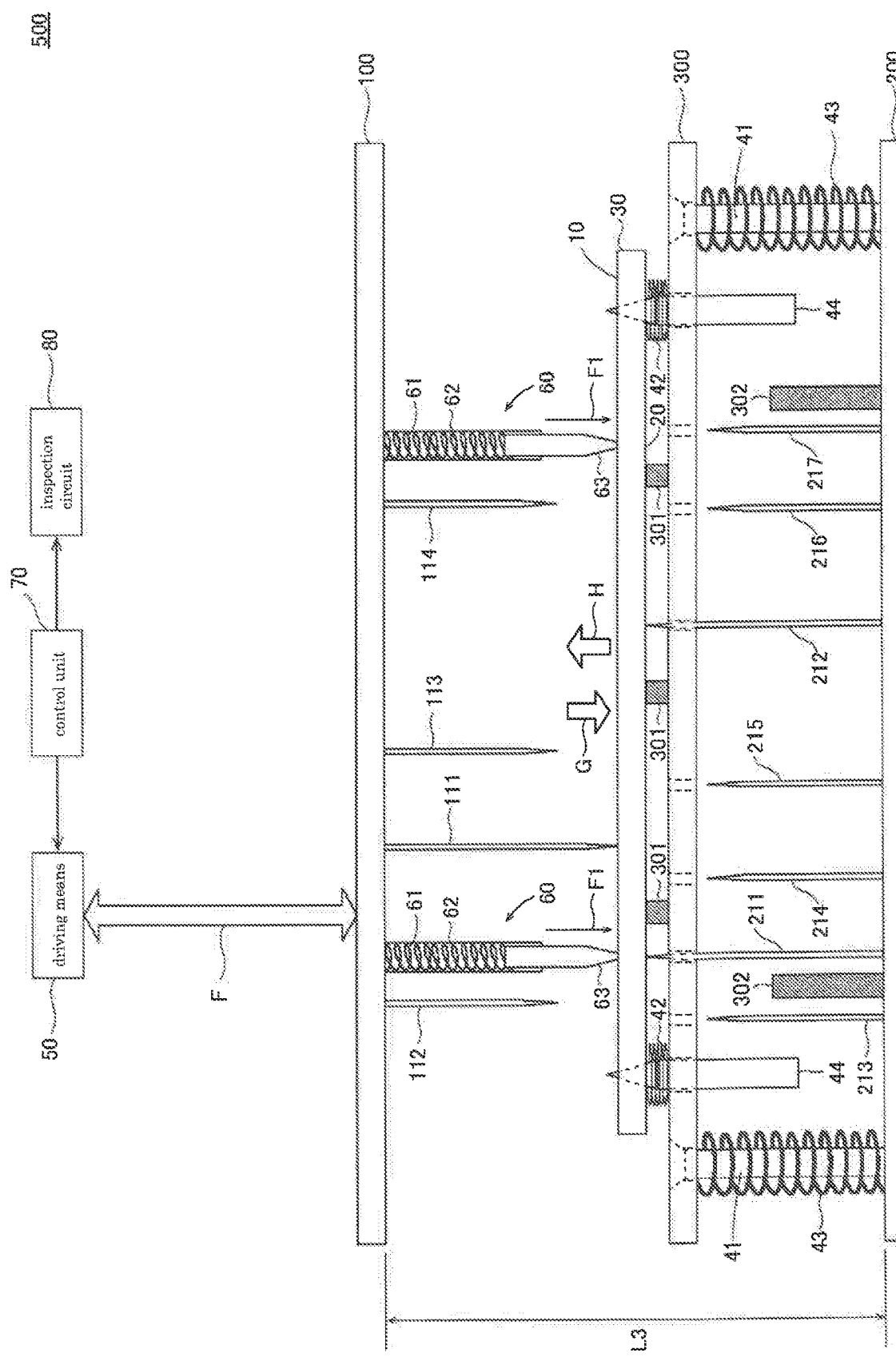
FIG. 3 is a front view illustrating the present apparatus in which a separation distance between the first probe base and the second probe base is held at intermediate and only long probes are in contact and short probes are not in contact with the sandwiched substrate in a boundary scan test mode.

FIG. 3 is a front view illustrating the present apparatus in which a separation distance between the first probe base and second probe base is held at intermediate and only long probes are in contact and short probes are not in contact with the sandwiched substrate in a boundary scan test mode. As illustrated in FIG. 3, the first probe base 100 and second probe base 200 are held in a state (hereinafter also referred to as "middle state") at an intermediate separation distance L3. It should be noted that the middle state (FIG. 3) can be transitioned into from either separated state (FIG. 1) or the closed state (FIG. 2). Accordingly, in the case of ordering different inspections using the distinction between the closed state (FIG. 2) and the middle state (FIG. 3), either one may come before the other.

The distance between the upper surface 10 of the substrate 30 and the first probe base 100 is selected such that only the long probes 111 are in contact and the short probes 113, 114 are not in contact. Likewise, the distance between the second surface 20 of the substrate 30 and the second probe base 200 is selected such that only the long probes 211, 212 are brought into contact and the short probes 213-217 are not brought into contact.

Figure 4:
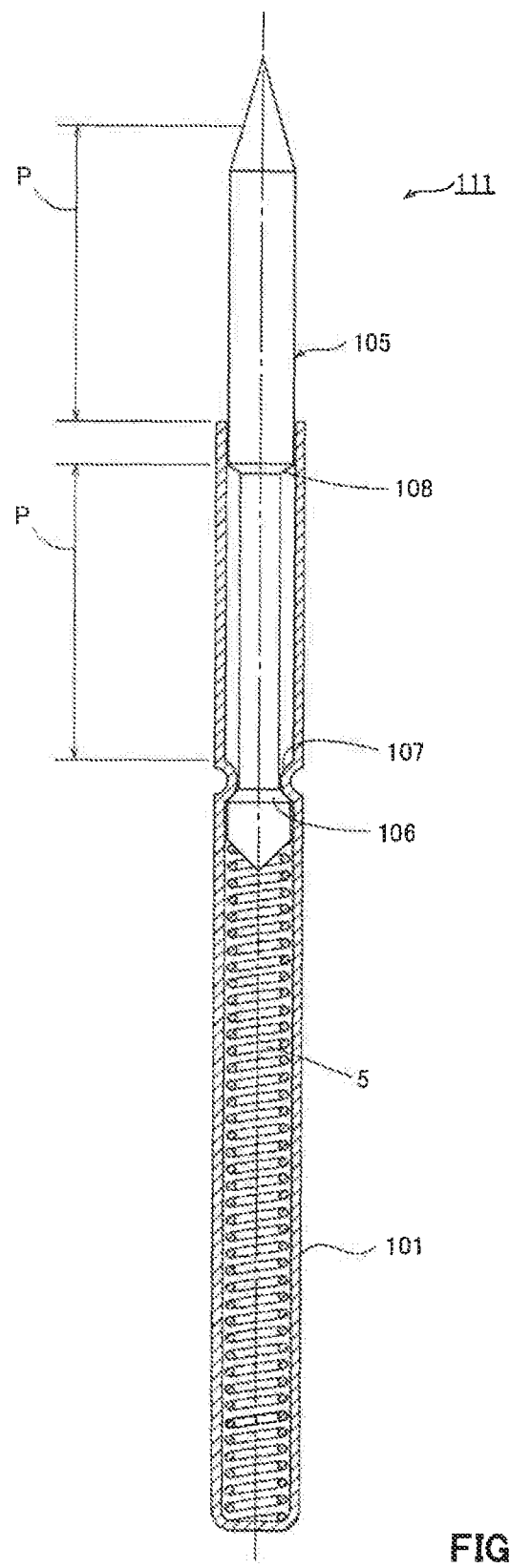
FIG. 4 is a partial longitudinal cross-sectional view illustrating details of a long probe which can be used in the present apparatus.

Hereinafter, probes usable in the present apparatus will be described in further detail with reference to FIGS. 4 and 5. FIG. 4 is a partial longitudinal cross-sectional view illustrating details of a long probe which can be used in the present apparatus. The long probe 111 (and similarly in 211, 212) illustrated in FIG. 4 is in a telescoping configuration having a sleeve 101 incorporating a spring 5 into which a needle-shaped core rod 105 is extendably/retractably inserted; the core rod 105 is biased in an outward direction with a pressing force by an elastic force of the spring 5. Moreover, in this probe 111, when retracted a full stroke P, the tip retreats to the vicinity of the upper end of the sleeve portion 101.

In the lower half of the core rod 105 always retained within the sleeve portion 101, a reduced-diameter portion having a small diameter is formed. In other words, excepting both ends, the core rod 105 is roughly constituted by two diameters in a reduced-diameter section and increased-diameter sections. At boundaries between the reduced-diameter section and the increased-diameter sections, a standby height restricting stepped portion 106 and a stroke restricting stepped portion 108 are formed. Meanwhile, the sleeve 101 has a constriction having a diameter smaller than other wide portions at approximately a third of the length away from the upper end of the sleeve 101 as a stroke restricting stopper 107. It should be noted that the location of the stroke restricting stopper 107 may be more than one third of the length away from the upper end of the sleeve 101.

In the telescoping configuration of the probe 111, the core rod 105 is supported in the sleeve 101 and can freely advance and retreat. When the core rod 105 advances or retreats, butting of the standby height restricting stepped portion 106 and the stroke restricting stepped portion 108 against the stroke restricting stopper 107 prohibits further motion. Thus, the stroke of the core rod 105 of the probe 111 is regulated.

Figures 5A, 5B:
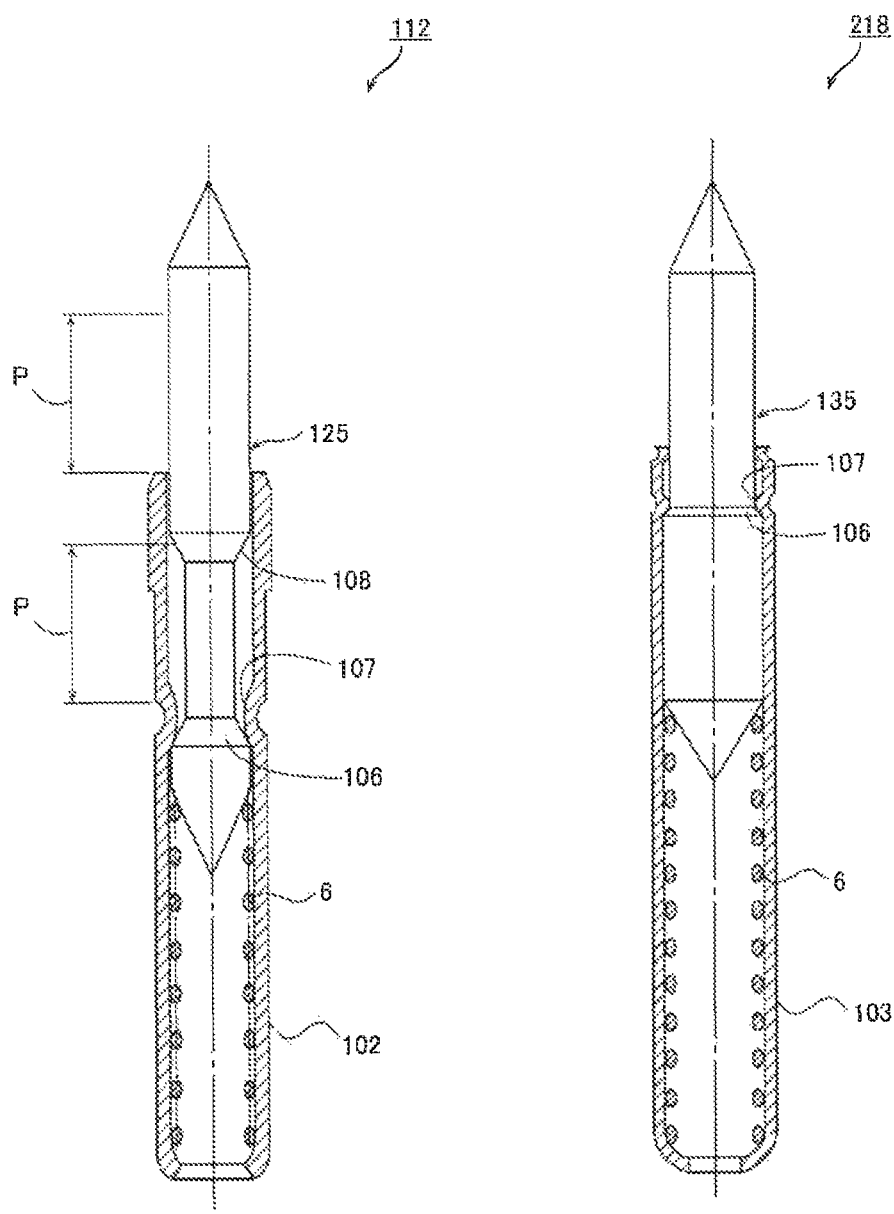
FIG. 5A and FIG. 5B are partial longitudinal cross-sectional views comparatively illustrating slightly different short probes used in the present apparatus.

FIG. 5A and FIG. 5B are partial longitudinal cross-sectional views comparatively illustrating slightly different short probes used in the present apparatus; FIG. 5A illustrates a configuration having stepped portions in two locations to regulate advance/retreat of a core rod, and FIG. 5B illustrates a configuration having a stepped portion in one location to regulate advance/retreat of a core rod. The short probes 112, 218 (as well as 113, 114, 213-217) illustrated in FIG. 5 are in a telescoping configuration in which a needle-shaped core rod 125, 135 is extendably inserted into a sleeve 102, 103 incorporating a spring 6; elasticity of the spring 6 presses and biases the core-rod 125, 135 in an outward direction.

In the probe 112 illustrated in FIG. 5A, as stepped portions to regulate advance/retreat of the core rod 125, a standby height restricting stepped portion 106 and a stroke restricting stepped portion 108 are formed in two locations of the core rod 125. Thus, the configuration having stepped portions in two locations is the same as that of the probe 111 described with reference to FIG. 4. The probe 112 illustrated in FIG. 5A is, in basic respects, the same as the probe 111 illustrated in FIG. 4 and a standby height is restricted by a standby height restricting stepped portion 106 butting against a stroke restricting stopper 107 provided on the inner diameter of the sleeve 102. Furthermore, a stroke P for the core rod 125 is restricted in a direction receding into the interior of the sleeve 102 by a stroke restricting stepped portion 108 butting against the stroke restricting stopper 107.

The probe 218 illustrated in FIG. 5B has only the standby height restricting stepped portion 106 in one location of the core rod 135 as a stepped portion to regulate advance of the core rod 135. In such a configuration, the stroke of the core rod 135 in a direction receding into the interior of the sleeve 103 is not strictly regulated. Accordingly, the core rod 135 can retreat until the spring 6 is fully compressed or until a contact point retracts to the same height as the upper end opening of the sleeve 103.

Figure 6:
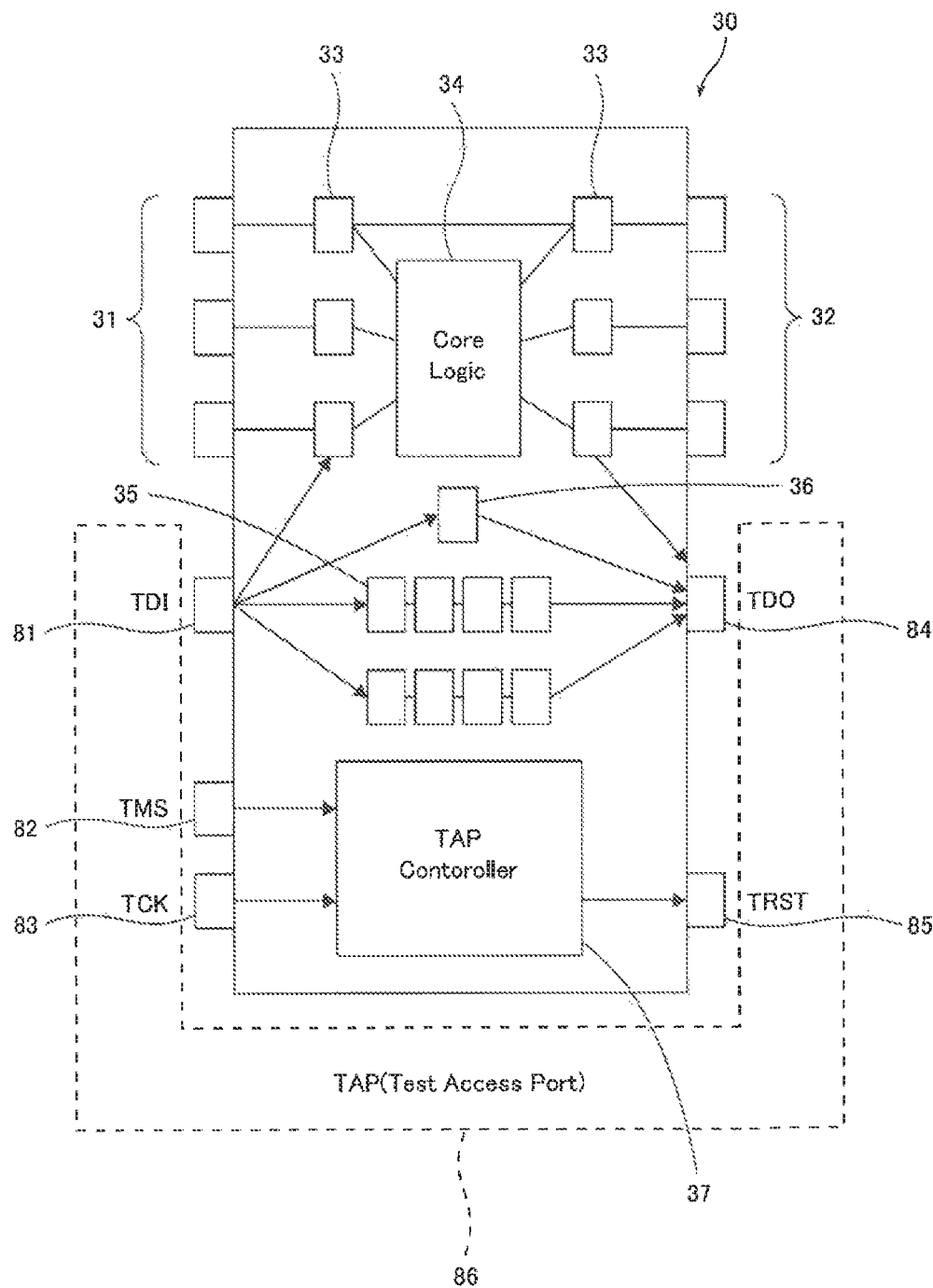
FIG. 6 is a layout diagram for explaining the present apparatus selectively bringing only long probes into contact with a substrate in a boundary scan test mode.

FIG. 6 is a layout diagram for explaining selectively bring only long probes in contact with a substrate in a boundary scan test mode. As illustrated in FIG. 6, the substrate 30 has input signal terminals 31, output signal terminals 32, and a test access port (hereinafter also referred to as "TAP") 86 for external input/output.

Furthermore, the substrate 30 has a boundary scan register (hereinafter also referred to as "cell") 33 and a device core logic (hereinafter referred to as simply "core logic") 34 interposing between the input signal terminals 31 and the output signal terminals 32.

The TAP 86 includes a TDI (test data in) 81, a TMS (test mode select) 82, a TCK (test clock) 83, a TDO (test data out) 84, and a TRST (test reset) 85. Furthermore, the substrate 30 includes an instruction register 35, a bypass register 36, and a test access port controller (hereinafter also referred to as "TAP controller") 37 connected to appropriate terminals in the TAP 86.

The instruction register 35 is configured in multiple stages connected in series. The bypass register 36 is connected in parallel with the instruction register 35. The instruction register 35 and bypass register 36 are thus connected in parallel between the TDI 81 and the TDO 84. The TAP controller 37 is connected with the TMS 82, the TCK 83, and the TRST 85.

The core logic 34 is a semiconductor chip supporting a CPU (central processing unit) which is not illustrated and is responsible for exchanging signals with peripheral circuits. The core logic 34 often includes circuits such as memory controller circuits, graphics interface circuits, storage interface circuits, and general-purpose I/O circuits.

The instruction register 35 partially constitutes an execution unit of the CPU, and stores an instruction currently being executed. In a simple processor, when executing each instruction, each instruction is stored in the instruction register 35 and held until decoded and executed. It should be noted that a detailed description of functions and operations of specific substrates 30 is omitted here.

The TDI 81 is an input signal terminal for test data. The TMS 82 is an input signal terminal for controlling a test operation. The TCK 83 is an input signal terminal for a test clock. The TDO 84 is an output signal terminal for result data. The TRST 85 is an input signal terminal for initializing the TAP controller 37.

The substrate 30 incorporates a function for performing the boundary scan test. This boundary scan test function is constituted by the boundary scan register (cell) 33 and the TAP controller 37 situated between the input/output signal terminals 31, 32 and core logic 34.

It should be noted that the boundary scan test may or may not be executable for all devices. In the substrate 30 illustrated in FIG. 6, the TAP controller 37 has a control function. With this control function, it is possible to execute the boundary scan test in coordination with the cell 33. Accordingly, in the present method using the present apparatus 500, in the case of inspecting the substrate 30 having a device having a function similar to the example illustrated in FIG. 6, a boundary scan is performed.

As will be described in the following with reference to FIGS. 7 and 9, in the present method using the present apparatus 500, an in-circuit test step (S310), a boundary scan test step (S320), and a functional test step (S330) are performed sequentially. First, in the in-circuit test step (S310), the present apparatus is in the closed state (FIG. 2) and all of the probes 111-114, 211-217 (as well as others not illustrated), both long and short, are brought into contact with each test land or other test point (not illustrated) of the substrate 30.

In the boundary scan test step (S320) and the functional test step (S330), the present apparatus 500 is in the middle state (FIG. 3), only probes selected according to requirement are brought into contact with specified test lands or test points of the substrate 30. Meanwhile, unneeded probes are removed from contact and separated from the substrate 30. It should be noted that the middle state (FIG. 3) can be achieved by transitioning from either the separated state (FIG. 1) or the closed state (FIG. 2). Accordingly, in ordering of the in-circuit test step (S310) performed in the closed state (FIG. 2) and the boundary scan test step (S320) as well as the functional test step (S330) performed in the middle state (FIG. 3), any one may be performed before the others.

In the boundary scan test step (S320), the long probes 111, 211, 212 illustrated in FIG. 3 (as well as others not illustrated) are brought into contact with only the five terminals of the TAP 86 illustrated in FIG. 6, that is, only the TDI 81, the TMS 82, the TCK 83, the TDO 84, and the TRST 85. At this time, the short probes 112-114, 213-217 illustrated in FIG. 3 (as well as others not illustrated) would interfere with the boundary scan test and are removed and separated from each land or test point (not illustrated) of the substrate 30. This enables improved performance in the boundary scan test.

Finally, in the functional test step (S330), probes selected as appropriate (not illustrated) are brought into contact with the input signal terminals 31 and output signal terminals 32 of the substrate 30. Thus, if the output signals correspond with the applied input signals as expected, the inspection is considered passed.

As will be described below, the selective contact/separation operation of each of the probes in the functional test step (S330) can be realized by increasing the number of stages with respect to that of the selective contact/separation operation of each of the probes implemented in the boundary scan test (S320). Moreover, the boundary scan test step (S320) and the functional test step (S330) may be performed in either order.

In the present apparatus 500, according to switching of the inspection functions, it is possible to selectively bring probes 111-114, 211-217 into contact with substrate 30. The basis for selection is length of the probes 111-114, 211-217 which can be brought into contact selectively in accordance with their different lengths. All of the probes 111-114, 211-217 are always electrically connected to an inspection circuit 80 via conductive wiring (not illustrated). Connection status between the probes 111-114, 211-217 and the substrate 30 changes as appropriate in accordance with each change in inspection function of the inspection circuit 80 among the boundary scan test, the in-circuit test, and the functional test.

As illustrated in FIGS. 1, 2, 3, and 8, the pressing force H is a total of force of the spring 42, spring 43, and force of probes if they are in contact, upwardly pressing the lower surface 20 of the substrate 30. On the other hand, a pressing force G is a total force from the first pole 60 originating from the driving force F and force of probes if they are in contact, downwardly pressing the upper surface 10 of the substrate 30. The control unit 70 can adjust a strength relation between the pressing force H and the pressing force G by adjusting the driving force F. Consequently, in the present apparatus 500, it is possible to differentiate separation distance L1-L3 into three levels of maximum L1, minimum L2, and intermediate L3, or more levels.

Opening the separation distance L1-L3 to the maximum L1 produces a state in which the substrate 30 is replaceable. Closing the separation distance L1-L3 to the minimum L2 brings all of the probes 111-114, 211-217 into contact with the sandwiched substrate 30 and produces a state in which the in-circuit test is enabled. Holding the separation distance L1-L3 at the intermediate L3 brings only long probes 111 into contact with the substrate 30 and produces a state in which the boundary scan test can be performed.

Probes 111-114 having different lengths are vertically attached to the first probe base 100. These are capable of being brought into contact with the upper surface 10 of the substrate 30. Likewise, probes 211-217 having different lengths are vertically attached to the second probe base 200. These are capable of being brought into contact with the second surface 20 of the substrate 30.

The first probe base 100 and the second probe base 200 operate to decrease and increase distance from each other so as to sandwich the substrate 30. Thereby, electrical inspections can be performed while selectively bringing the probes 111-114, 211-217 having different lengths into contact with the substrate 30 according to the inspection step.

Figure 7:
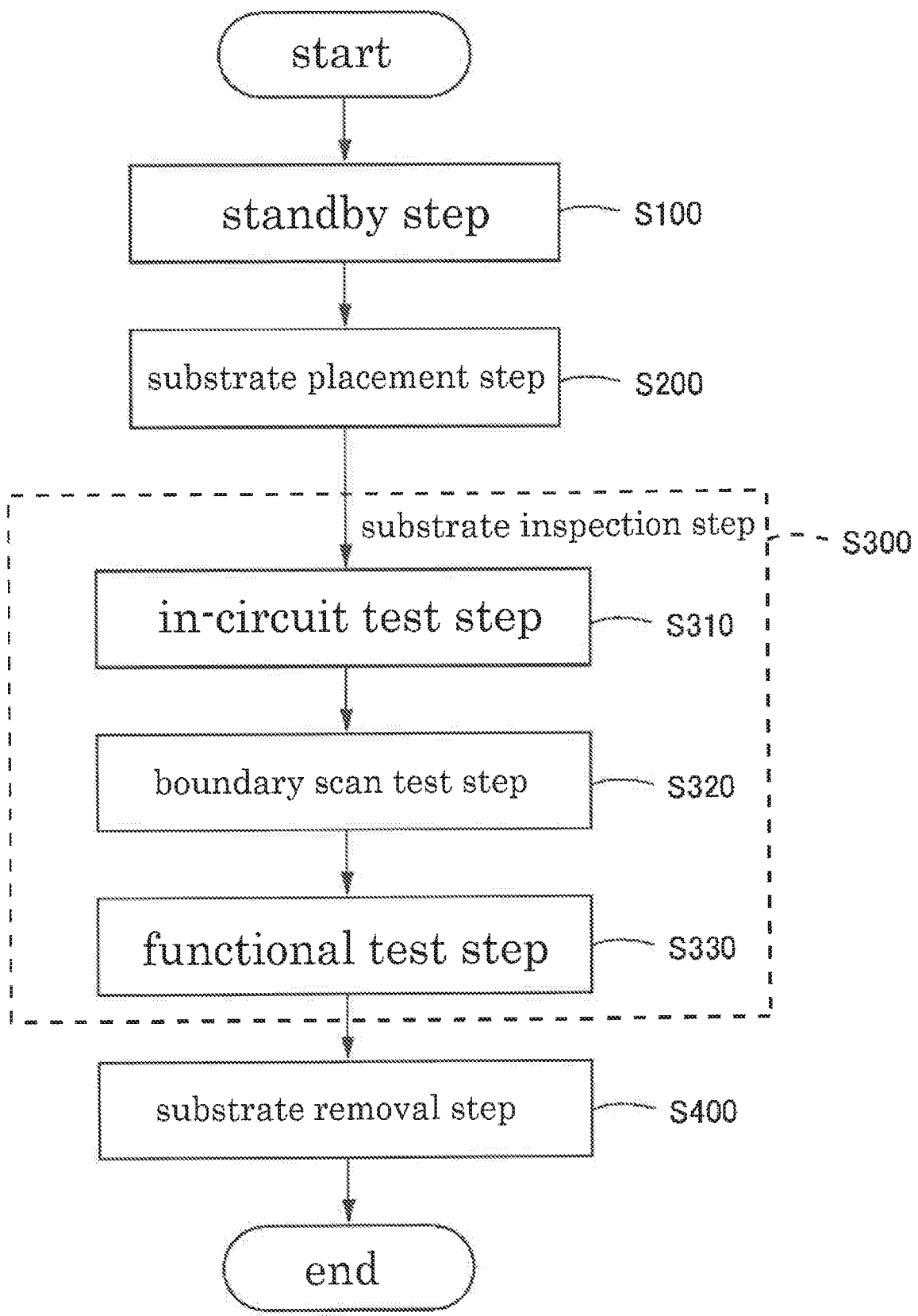
FIG. 7 is a flowchart of procedures of a multifunctional substrate inspection method (hereinafter also referred to as "the present method") according to the present disclosure.

FIG. 7 is a flowchart of procedures of the present method. As illustrated in FIG. 7, the present method includes a standby step (S100), a substrate placement step (S200), a substrate inspection step (S300), and a substrate removal step (S400). In the standby step (S100), the control unit 70 activates the driving means 50 so that the second probe base 200 and first probe base 100 open to maximum L1 of the separation distances L1-L3 and stands by. It should be noted that the middle state (FIG. 3) can be achieved by transitioning from either the separated state (FIG. 1) or the closed state (FIG. 2).

Subsequently, in the substrate placement step (S200), the substrate 30 is placed on the intermediate plate 300 positioned between the first probe base 100 and the second probe base 200. Next, in the substrate inspection step (S300), the control unit 70 causes the driving means 50 to generate a driving force F. This driving force F, while resisted by the elastic forces of the springs 42, 61, 43, decreases and increases separation distances L1-L3 between the first probe base 100 and the second probe base 200 to multiple levels. Thus, in accordance with the operation of changing the separation distances L1-L3, the inspection circuit 80 switches the inspection functions while different inspections are sequentially performed.

In the substrate removal step (S400), the control unit 70 causes the driving means 50 to open to the maximum L1 state of the separation distances L1-L3. Now, the substrate 30 having completed the inspection is removed from the present apparatus 500 by the operator or inspector and forwarded to an assembly process or shipping process of the substrate 30 which are not illustrated in the drawings.

The substrate inspection step (S300) is a combination of any two or more of the in-circuit test (S310), the boundary scan test step (S320), and the functional test step (S330).

The first pole 60 is extendable and vertically attached to the first probe base 100. When this first pole 60 presses the first surface (upper surface) 10 of the substrate 30 with a pressing force F1 originating from the driving force F, the substrate 30 approaches the intermediate plate 300. Meanwhile, the intermediate plate 300 also approaches the second probe base 200. During the stroke of this reversible operation, the probes 111-114, 211-217 can be selectively brought into contact with the substrate 30 according to their different lengths.

The separation distances L1-L3 can be differentiated into three levels of maximum L1, minimum L2, and intermediate L3. Furthermore, in the standby step (S100), the substrate placement step (S200), and the substrate removal step (S400), the separation distance L1-L3 is opened to the maximum L1 which allows replacement of the substrate 30.

A first stage of the substrate inspection step (S300) is the in-circuit test step (S310). In this in-circuit test step (S310), the separation distance L1-L3 is closed to minimum L2 and all of the probes 111-114, 211-217 are brought into contact with the sandwiched substrate 30.

A second stage of the substrate inspection step (S300) is the boundary scan test step (S320). In this boundary scan test step (S320), the separation distance L1-L3 is held at intermediate L3 and only the long probes (111, 211, 212) are brought into contact with the substrate 30. The boundary scan test step (S320) or the functional test step (S330) is performed with only the long probes 111, 211, 212 (as well as others not illustrated) remaining after reducing a number of contacts relative to the in-circuit test step (S310).

Furthermore, the first pole 60 is an example of a member that is elastically extendable/retractable between maximum and minimum length. The telescoping structure of this first pole 60 extends and retracts with a pressing force F1 of an incorporated first biasing means (spring) 61 while flexibly pressing a surface 10 of the substrate 30. As will be described below, this ability to flexibly press the substrate 30 reduces sudden loads such as bending applied to delicate structures on the substrate 30, which not only prevents damage from the inspection but also raises test result accuracy.

Hereinafter, balance between the driving force F in the downward direction as illustrated in FIGS. 1 to 3 and the pressing force H in the upward direction of a total of an elastic force of the of a second biasing means (spring) 42, a third biasing means (spring) 43, and other elastic forces will be considered. The separation distance L1-L3 is brought to the minimum L2 by contracting the spring 61, the spring 42, and the spring 43 with the downward driving force F and the upward force H resisting the elastic forces of the springs and other components.

In the present method using the present apparatus 500, with respect to the selective contact/separation operation of each of the probes, by differentiating the separation distance L1-L3 into minimum L2 and intermediate L3 states, two different states can be obtained in which all of the probes 111-114, 211-217 are brought into contact in the in-circuit test step (S310) and only the long probes 111, 211, 212 are brought into contact with the substrate 30 in the boundary scan test step (S320).

It is also possible to increase the number of states from the two different states to three different states. In this regard, although actual illustration is omitted in the drawings, the first pole 60 may be configured to enable changing length into more levels and performing more types of inspections in coordination with multistage control of the control unit 70. For example, in order to transition from the in-circuit test step (S310) to the boundary scan test step (S320) and the functional test step (S330), further differentiation of probes contacting the substrate 30 into more levels is possible.

First, medium-length probes (not illustrated) having a length so as to be positioned between lengths of the long probes 111, 211, 212 and short probes 112-114, 213-217 are selected. Furthermore, the control unit 70 controls in multiple stages according to changes in inspection steps. Thus, as a first stage, all long, medium-length, and short probes are brought into contact. As a second stage, long as well as medium-length probes are in contact. As a third stage, only long probes are in contact so that, in this manner as well, contact of probes can be differentiated.

Finally, in the substrate removal step (S400), the separation distance L1-L3 between the first probe base 100 and second probe base 200 is opened to maximum L1 and the substrate 30 is removed. This completes the substrate inspection according to the present method.

Figure 8:
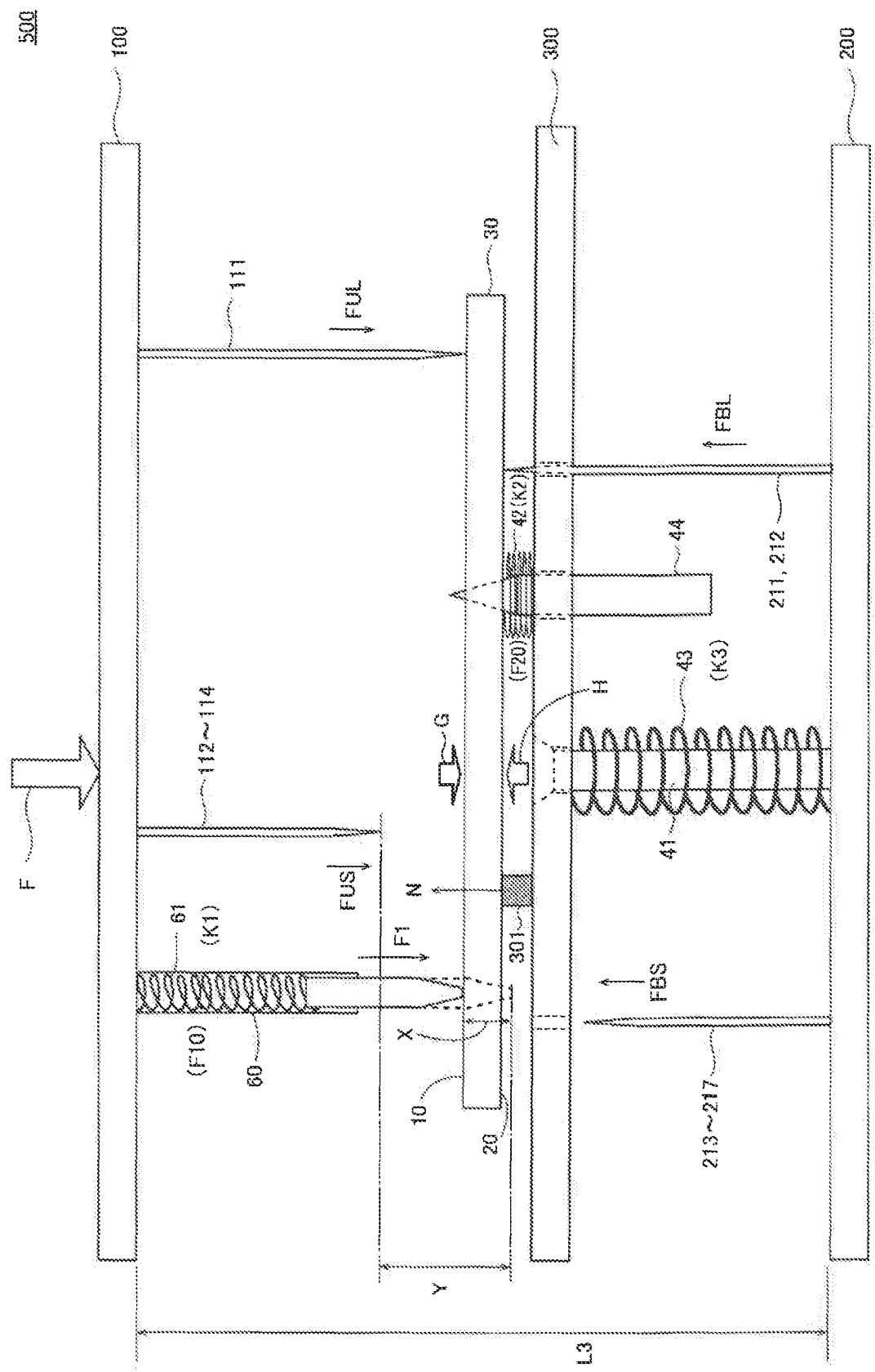
FIG. 8 is a simplified schematic explanatory view of FIG. 3 for explaining various springs and other components provided in the present apparatus.

FIG. 8 is a simplified schematic explanatory view (hereinafter also referred to as "simplified model") which is a simplification of FIG. 3 and used for explaining various springs and other components provided in the present apparatus. It should be noted that the driving means 50, control unit 70 and the inspection circuit 80 are not illustrated in FIG. 8 for clarity. In the following description, as illustrated in FIGS. 3 and 8, in order to enable the boundary scan test step (S320), a first condition and a second condition are explained for clarification below to improve reproducibility.

The first condition is that the separation distance L1-L3 between the first probe base 100 and second probe base 200 is held at intermediate L3.

The second condition is that, during the boundary scan test step (S320), the short probes 112-114 are not brought into contact with the upper surface 10 of the substrate 30. Likewise, the lower side short probes 213-217 are not brought into contact with the lower surface 20 of the substrate 30.

Factors of a simplified model of FIG. 8 are given below. It should be noted that "elastic" used below means approximately the same concept as "bias."

K1: spring constant of the spring 61 (first biasing means incorporated in the first pole)

F10: initial elastic force of spring 61

F1: force of pressing of the first pole 60 (also referred to as "pressing force") exerted on the substrate 30

Given a compression displacement X of the spring 61, F1 can be calculated according to the following Formula (1). However, in the state of FIG. 2, in addition to the right side of the following Formula (1), a larger force is exerted.

$$F1 = F10 + K1*X \tag{1}$$

K2: spring constant of spring 42 (the second biasing means interposed between the intermediate plate 300 and the substrate 30)

F20: initial elastic force of spring 42

K3: spring constant of spring 43 (the third biasing means interposed between the second probe base 200 and the intermediate plate 300)

It should be noted that, among the springs 61, 42, 43, when the same surface is suspended by a plurality of springs, these spring act with a resultant force (the spring constants are synthesized in parallel).

F: driving force causing vertical movement of the first probe base 100 (upper side)

G: sum of downward pressing force (also referred to simply as "pressing force") acting on the upper surface 10 of the substrate 30

H: sum of upward pressing force (also referred to simply as "pressing force") acting on the lower surface 20 of the substrate 30

N: normal force received by the substrate 30 from spacers 301 when the substrate 30 is in contact with the spacers 301 of the intermediate plate 300

Y: difference in length between the short probes 112-114 and first pole 60 of the first probe base 100 (upper side)

FUL: downward pressing force of the long probe 111 of the first probe base 100 (upper side) on the upper surface 10 of the substrate 30 (assumed constant)

FUS: downward pressing force of the short probes 112-114 of the first probe base 100 (upper side) on the upper surface 10 of the substrate 30 (assumed constant)

FBL: upward pressing force of the long probes 211, 212 of the second probe base 200 (lower side) on the lower surface 20 of the substrate 30 (assumed constant)

FBS: upward pressing force of the short probes 213-217 of the second probe base 200 (lower side) on the lower surface 20 of the substrate 30 (assumed constant)

It should be noted that, in the case of a plurality of probes applying pressure on the same substrate surface, the force is the total force.

Here, a condition shown in the following Formula (2) is set for the spring constants of the factors of the simplified model described above.

$$K2 < K1 < K3 \tag{2}$$

By meeting the condition of Formula (2) given above, satisfying the above-described first condition, and appropriately adjusting the driving force F, the separation distance L1-L3 between the first probe base 100 and the second probe base 200 can be held at intermediate L3.

In a state satisfying the first condition based on Formula (2) given above, while transitioning from the substrate placement step (S200) of FIG. 1 to the in-circuit test step (S310) of FIG. 2, the spring 42 is completely compressed before compression of the spring 61 begins (FIG. 3). Subsequently, after the spring 61 is completely compressed, compression of the spring 43 finally begins. (FIG. 2).

In addition to such operating conditions, by satisfying the second condition, in a state in which the separation distance L1-L3 between the first probe base 100 and second probe base 200 is held at intermediate L3, the boundary scan test step (S320) in which only the long probes 111, 211, 212 are brought into contact with the substrate 30 can be performed.

As described above, with respect to the selective contact/separation operation of each of the probes by differentiating separation distance L1-L3 into the minimum L2 state and intermediate L3 state, two different states can be achieved for the in-circuit test step (S310) in which all of the probes 111-114, 211-217 are brought into contact and for the boundary scan test step (S320) in which only the long probes 111, 211, 212 are brought into contact with the substrate 30.

Under the driving force F of the driving means 50, the first probe base 100 gradually descends to proceed from the substrate placement step (S200) to the in-circuit test step (S310). In this process, each of the probes 111-114, 211-217 are brought into contact with the substrate 30 in the order described below.

Let X be the compression displacement of the spring 61 in the boundary scan test step (S320) illustrated in FIG. 3. At this time, the spring 42 is brought into its most compressed state.

Moreover, according to the above Formula (2) K2<K1<K3, the amount of compression displacement of the spring 43 is ignored at this stage.

Pressing forces G, H respectively acting on both surfaces 10, 20 of the substrate 30 are in an equilibrium state as on both sides of the following Formula (3).

Thus, in Formula (3) below, the left side is the downward pressing force G and the right side is the upward pressing force H.

$$K1*X + F10 + FUL = F20 + K2*X + N + FBL \tag{3}$$

It should be noted that, K2*X can be ignored according to Formula (2) K2<K1<K3.

$$K1*X + F10 + FUL = F20 + N + FBL \tag{4}$$

The normal force N from the spacer 301 is positive as shown in Formula (5) which is a rearrangement of Formula (4).

$$N = K1*X + F10 - F20 + FUL - FBL > 0 \tag{5}$$

Formula (5) above is sequentially rearranged in Formulae (6) and (7) below to find the compression displacement X of the spring 61.

$$K1*X > F20 - F10 + FBL - FUL \tag{6}$$

therefore, $$X > (F20 - F10 + FBL - FUL)/K1 \tag{7}$$

The second condition is that, during the boundary scan test step (S320), the upper side probes 112-114 are not brought into contact with the upper surface 10 of the substrate 30. In order to satisfy the second condition, the difference Y in length (FIG. 1, FIG. 8) between the upper side short probes 112-114 and the first pole 60 is set to be greater than X in Formula (7) above and must satisfy Formula (8) below.

$$Y > X > (F20 - F10 + FBL - FUL)/K1 \quad (8)$$

It should be noted that the second condition includes a condition that the lower side short probes 213-217 are not brought into contact with the lower surface 20 of the substrate 30; however, a detailed description thereof is omitted.

Figure 9:
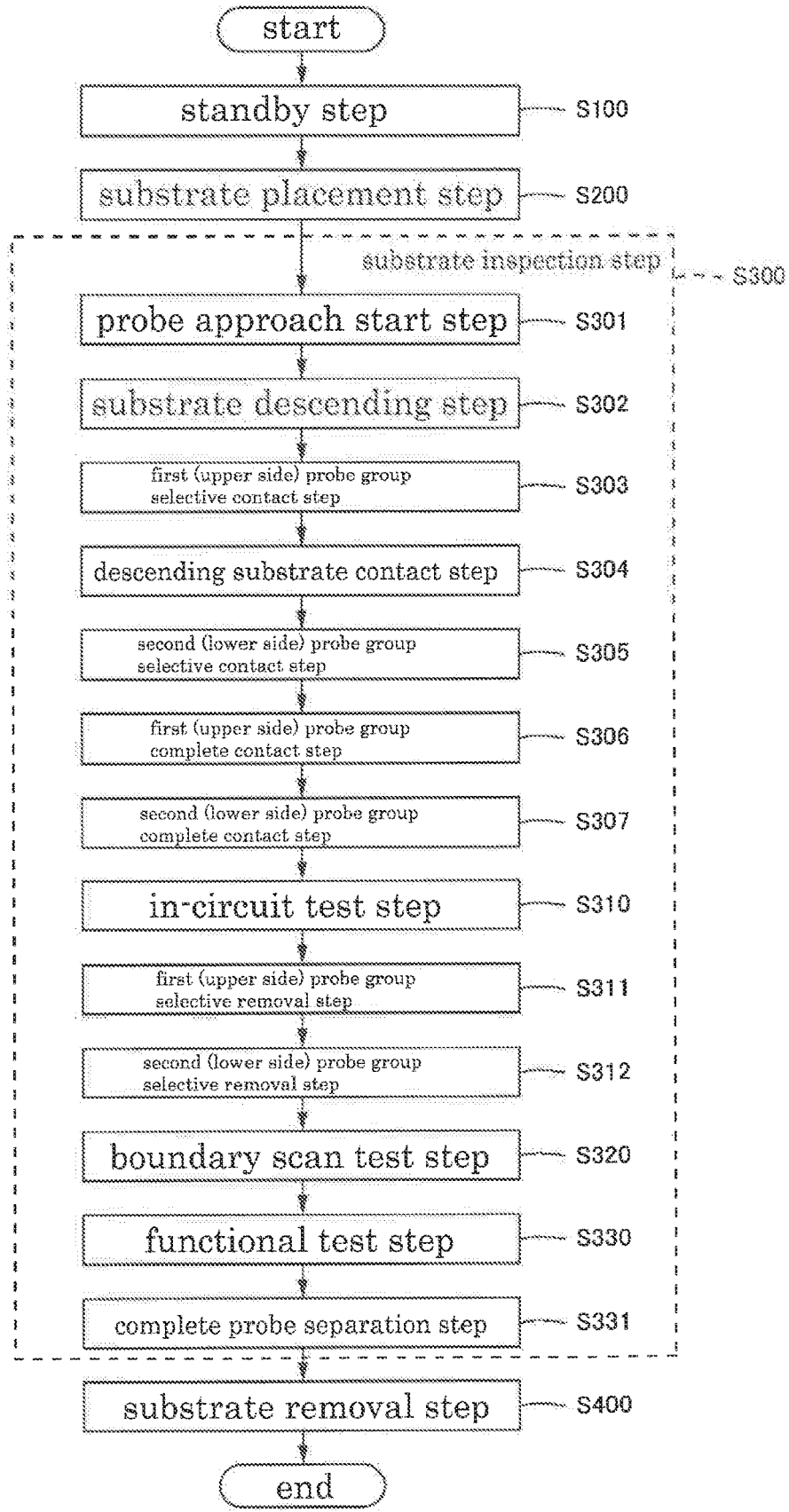
FIG. 9 is a flowchart of procedures of the present method based on functions of each of the springs illustrated in FIG. 8.

FIG. 9 is a flowchart of procedures of the present method based on functions of each of the springs illustrated in FIG. 8. This FIG. 9 is based on the flowchart of FIG. 7 and is for explaining the substrate inspection step (S300) in further detail. As illustrated in FIG. 9, the substrate inspection step (S300) according to the present method includes a probe approach start step (S301), a substrate descending step (S302), a first (upper side) probe group selective contact step (S303), a descending substrate contact step (S304), a second (lower side) probe group selective contact step (S305), a first (upper side) probe group complete contact step (S306), a second (lower side) probe group complete contact step (S307), an in-circuit test step (S310), a first (upper side) probe group selective removal step (S311), a second (lower side) probe group selective removal step (S312), a boundary scan test step (S320), a functional test step (S330), and a complete probe separation step (S331).

In the probe approach start step (S301), the driving force F of the driving means 50 pushes the first probe base 100 down. In the substrate descending step (S302), by the elastic force of the spring 61 overcoming the spring 42, the first pole 60 presses the substrate 30 down with a pressing force F1. It should be noted that, as described with reference to FIG. 8, the sum G of downward pressing force acting on the upper surface 10 of the substrate 30 includes the pressing force FUL of the long probes 111 of the first probe base 100 (upper side) as well as the pressing force FUS of the short probes 112-114.

In the first (upper side) probe group selective contact step (S303), the long probe 111 of the first probe base 100 is brought into contact with the substrate 30. In the descending substrate contact step (S304), the spacer 301 of the intermediate plate 300 is brought into contact with the lower surface 20 of the substrate 30.

In the second (lower side) probe group selective contact step (S305), the long probes 211, 212 of the second probe base 200 are brought into contact with the lower surface 20 of the substrate 30. In the first (upper side) probe group complete contact step (S306), the driving force F of the driving means 50 overcomes the elastic force of the springs 42, 61 as well as other forces and primarily acts on the first pole 60. Due to this driving force F, a rod 63 is received to some extent into a sleeve 62 to an intermediate length, that is, retracts to a length that is slightly greater than the sleeve 62. Consequently, all of the long and short probes 111-114 of the first probe base 100 contact the upper surface 10 of the substrate 30.

In the second (lower side) probe group complete contact step (S307), the driving force F of the driving means 50 overcomes the elastic force of the springs 61, 42, 43 and other forces and primarily acts on the first pole 60. Due to this driving force F, the rod 63 is completely received into the sleeve 62 and retracts to a minimum length, that is, a length that is only as long as the sleeve 62. Then the first pole 60, which is maximally retracted and no longer elastic, presses the substrate 30 along with the intermediate plate 300 while resisted by the elastic force of the stiffest spring 43. Consequently, all of the long and short probes 211-217 of the second probe base 200 contact the substrate 30.

The in-circuit test step (S310) is performed in state in which all of the long and short probes 111-114, 211-217 of the first and second probe bases 100, 200 are in contact with the substrate 30 in the first (upper side) and second (lower side) probe group complete contact step (S306, S307).

In the first (upper side) probe group selective removal step (S311), the short probes 112, 114 of the first probe base 100 are separated from the substrate 30. Likewise, in the second (lower side) probe group selective removal step (S312), the short probes 213-217 of the second probe base 200 are separated from the substrate 30. Consequently, only the long probes 211, 212 remain in a state of maintaining contact with the substrate 30.

The boundary scan test step (S320) or the functional test step (S330) is performed with only the long probes 111, 211, 212 remaining after reducing a number of contacts relative to the in-circuit test step (310). It should be noted that actual tests may use long probes other than these three long probes 111, 211, 212; however, a detailed description thereof is omitted.

As described above, the middle state (FIG. 3) can be achieved by transitioning from either the separated state (FIG. 1) or the closed state (FIG. 2). Accordingly, in ordering of the in-circuit test step (S310) performed in the closed state (FIG. 2) and the boundary scan test step (S320) as well as the functional test step (S330) performed in the middle state (FIG. 3), any one may be performed before the others. In explaining this with reference to FIG. 9, the boundary scan test step (S320) or the functional test step (S330) may be performed between the second (lower side) probe group selective contact step (S305) and first (upper side) probe group complete contact step (S306).

Moreover, although not illustrated in the drawings, it is also possible to realize three varieties of test steps by using probes having three different levels of lengths, that is, long probes, medium-length probes, and short probes. In other words, three varieties of tests with a first test step with all probes in contact, a second test step with medium-length and long probes in contact, and a third test step with only long probes in contact.

In particular, the first test step is the in-circuit test step (S310), the second test step is the boundary scan test step (S320), and the third test is the functional test step (S330). It should be noted that these three types of test steps are just one example, and the first, second, and third test step do not necessarily need to be the in-circuit test step (S310), the boundary scan test step (S320), and the functional test step (S330).

In the complete probe separation step (S331), the control unit 70 lifts the first probe base 100 with the driving means 50, and the separation distance L1-L3 between the first probe base 100 and the second probe base 200 is opened to maximum L1 state. Next, in the substrate removal step (S400), the substrate 30 is removed from the present apparatus 500 thus completing the substrate inspection according to the present method. It should be noted that ordering of the first (upper side) probe group selective contact step (S303) and the second (lower side) probe group selective contact step (S305) may be reversed. Likewise, ordering of the first (upper side) probe group complete contact step (S306) and the second (lower side) probe group complete contact step (S307) may be reversed. Likewise, ordering of the first (upper side) probe group selective removal step (S311) and the second (lower side) probe group selective removal step (S312) may be reversed.

Hereinafter, effects of the present apparatus and present method will be more particularly explained. In high-speed digital inspections with conventional jigs, for example, in the case of performing a boundary scan test, as described above, to avoid adverse effects such as from unwanted radiation due to operation at high clock frequencies of several GHz, it is important to avoid contact between the substrate 30 and probes constituting an obstacle to accurate inspection results. In this boundary scan test, in the event of a problem, measures such as follows were required on the back surfaces (probe base portion side) of the probe bases (refer to FIGS. 1 to 3).

1) Disconnection as needed via a relay (not illustrated) for disconnecting the probe at wiring locations at which problems are expected.

2) In the case of a problem occurring in an unexpected location, it is necessary to disconnect the wiring upon each occurrence and, similarly, attach a relay.

3) Even when disconnected by the relay, there are cases of effects from impedance of wiring between the probe connected to the problem location and the relay interfering with the inspection. After investigating the cause, it is necessary to remove the probe connected with this problem location, thereby reducing efficiency of the test.

The present apparatus and present method using the present jig in a simplified configuration combined and semi-automated with a multifunctional inspection circuit are significantly effective in responding to the aforementioned problems. Thus, the present disclosure provides a multifunctional substrate inspection apparatus and a multifunctional substrate inspection method capable of performing multiple types of inspections on both sides of a substrate in multiple stages by selectively bringing only respectively required probes into contact with one of the both sides of a substrate to be inspected.

Hereinafter, a supplemental explanation of effects of the first pole 60 will be provided. As described above, the first pole 60 is pressed with the driving force F from the base, it is thus possible to flexibly press the first surface (upper surface) 10 of the substrate 30 with an extendable/retractable tip portion with a pressing force F1 accompanying the elastic force of the spring 61. In this manner, the first pole 60 flexibly presses the upper surface 10 of the substrate 30 with a pressing force F1 with an elastic force of the spring 61 interposed between the sleeve member 62 and the rod member 63.

Here, a case in which the first pole 60 does not have an elastic force with the spring 61 is assumed. Even in this case, by fixing the length of the first pole 60 at a length intermediate to lengths of the long probe 111 and the short probes 112-114, the first condition and the second condition described above are achieved. The first condition, holding the separation distance L1-L3 between the first probe base 100 and the second probe base 200 at intermediate L3, is maintained. Then, following from this first condition, the second condition is achieved. That is, at the time of the boundary scan test step (S320), the second condition of separating the short probes 112-114, 213-217 in contact with the upper/lower surfaces 10, 20 of the substrate 30 is achieved.

Thus, two different states can be achieved in which all of the probes 111-114, 211-217 are brought in contact for the in-circuit test step (S310) and in which only the long probes 111, 211, 212 are brought into contact with the substrate 30 for the boundary scan test step (S320). Thus, basic operation of the present apparatus 500 is achieved. However, even if the first pole 60 has a suitable length for allowing basic operation, in the case of the first pole 60 lacking flexibility in the length direction, there is insufficient ability to cope with displacement of the planar substrate 30 from a correct geometrically parallel plane.

In the majority of mounting substrates, thermal expansion generates undulations deviating from a perfect plane to some extent due to heat from soldering processes, for example, wave soldering processes using a solder reservoir and reflow soldering processes in which solder paste is finely printed. Problems with deviating from flatness are particularly pronounced in flexible substrates.

In particular, undulating substrates degrade accuracy of contact points in the case of probing, that is, bringing a probe into contact (hereinafter also referred to as "contacting a probe") with a point to be contacted such as a test pad formed by applying solder at a specified position on a pattern of the substrate 30. Furthermore, contact failures such as lateral slipping on hemispherical points to be contacted are problematic.

In view of this, a specialized cover known as an outline counterbore can be attached to the mounting substrate to correct flatness of the mounting substrates before bringing a probe into contact; however, there are limitations on the amount of flatness correction.

Moreover, even in the case of attaching the outline counterbore, when continuously performing a substrate inspection process at high speed, there is a concern that suddenly pressing the mounting substrate, contacting a probe with the substrate, and suddenly releasing the substrate after the inspection might generate high strain/stress in components/solder bonds and might cause substrate failure.

The following problems might occur in the case of the first pole 60 lacking flexibility in the length direction.

1) Probes on contact points are displaced such as by lateral slipping.

2) Solder balls of a BGA (ball grid array) are cracked in the case of surface mounting components such as IC chips when attempting to correct flatness of a bare board by force.

3) Chip components fracture when flattening a bare board.

In response to the aforementioned problems, as described above, a plurality of the first poles 60 provided in the present apparatus 500 more evenly and flexibly press the upper surface 10 of the substrate 30 via the elastic force of the spring 61 interposed between the sleeve member 62 and the rod member 63. In operation, due to pressing the substrate 30 uniformly and slowly, the substrate can be easily held while maintaining flatness before contacting a probe.

In this manner, the first poles 60 correct flatness of the substrate 30 over a specified time without undue forcing. In other words, there is an effect of eliminating warp in the substrate 30. Accordingly, when correcting flatness, this has an effect of suppressing deflection or bending stresses which might harm quality assurance of the substrate 30. When removing the probes from contact as well, the substrate 30 slowly returns to its original state. Consequently, even in the case of increased inspection speeds, this not only prevents damage caused by inspecting but also increases probe contact (probing) accuracy and stability so that there is an effect of improving continuous inspection accuracy.

Figure 10:
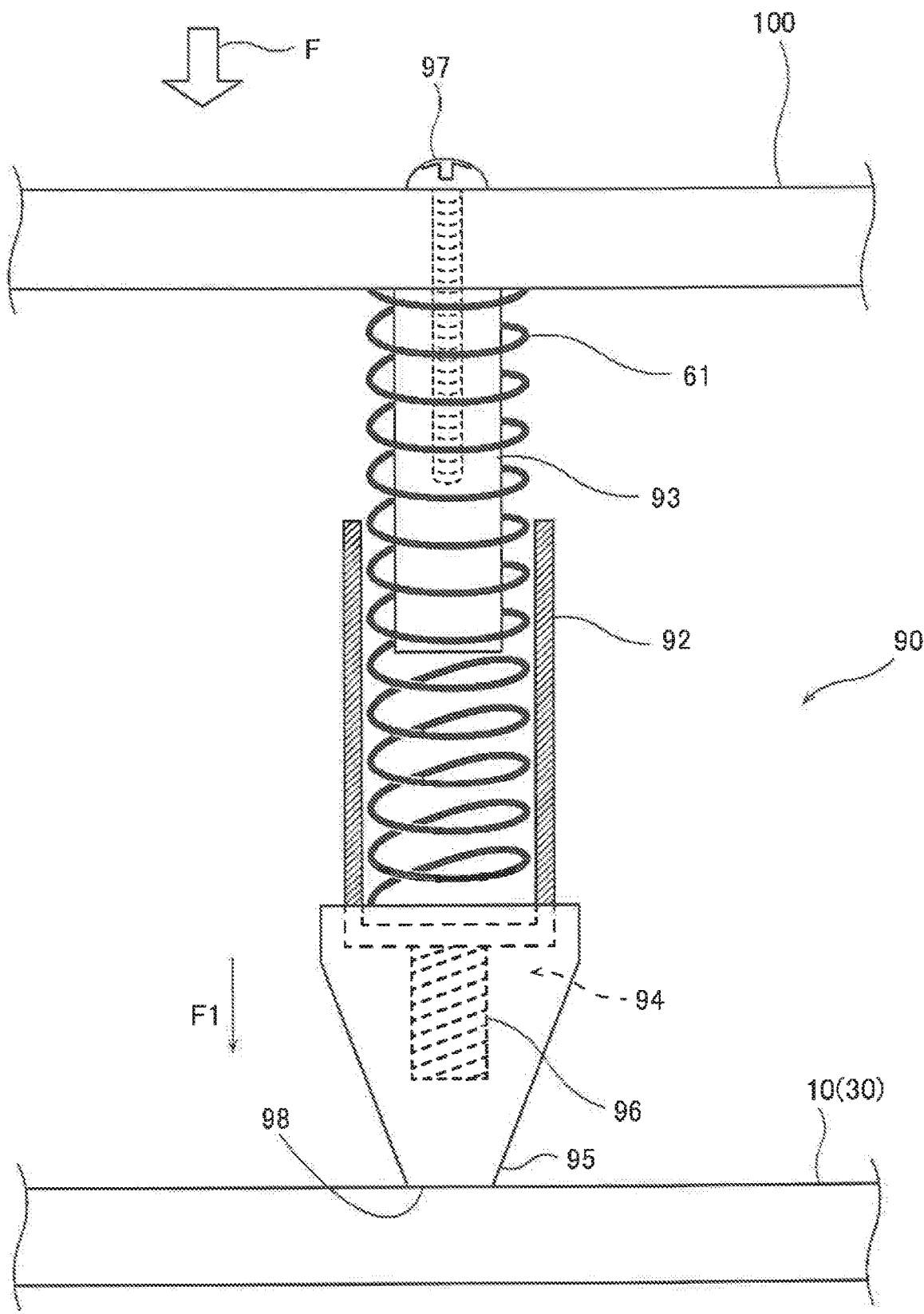
FIG. 10 is a partial cross-sectional view illustrating a modified example of a first pole used in the present apparatus.

FIG. 10 is a partial cross-sectional view illustrating a modified example of a first pole used in the present apparatus. A first pole 90 illustrated in FIG. 10 is secured by a screw 97 so that a support column 93 constituting a base portion is vertically attached to the first probe base 100 and has the same function as the first pole 60 illustrated in FIGS. 1, 2, 3, and 8. Thus, when pressing the first pole 90 with the driving force F from the base portion in the direction toward the tip, it is possible to flexibly press the first surface (upper surface) 10 of the substrate 30 with an extendable/retractable tip portion 94 with a pressing force F1 accompanying the elastic force of the spring 61.

This first pole 90 and the first pole 60 differ in two respects as follows. First, there is a difference in that a base portion is formed on a side of the support column 93 vertically attached to the first probe base 100 and an extendable/retractable tip portion 94 is formed on a side of a sleeve member 92 covering the support column 93. Moreover, there is also a difference in that a replaceable cap 95 is secured to the tip portion 94 by a screw member 96 in a male/female relation, and contact with the first surface 10 of the substrate 30 is made via a contact surface 98 of the replaceable cap 95. Furthermore, in addition to replacing when worn, the cap 95 is also made replaceable to change materials/factors as appropriate for different forms of the substrate 30 and contents of the inspection. It should be noted that the material constituting the cap 95 preferably has an insulating property to avoid damaging the substrate 30 with static electricity and preferably is a rubber or resin material having a cushioning property to reduce shock caused by the multistage operation of the present jig.

Modified Embodiment

Figure 11:
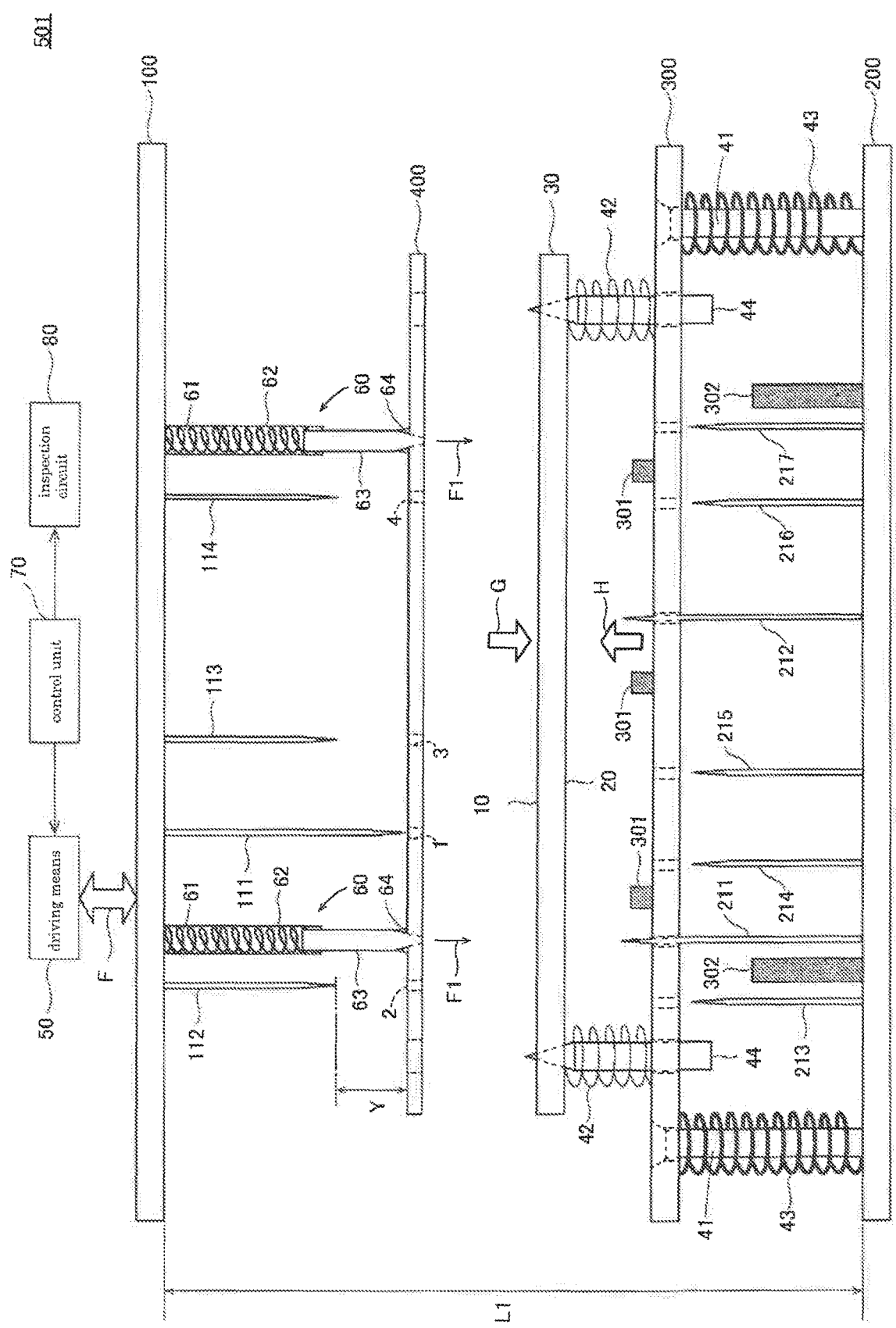
FIG. 11 is a front view illustrating a state of a modified embodiment of the multifunctional substrate inspection apparatus (hereinafter also referred to as "the modified apparatus") according to the present disclosure in which a first probe base and a second probe base are at maximum separation from each other and the mounting substrate is carried on an intermediate plate positioned between the first and second probe bases.
Figure 12:
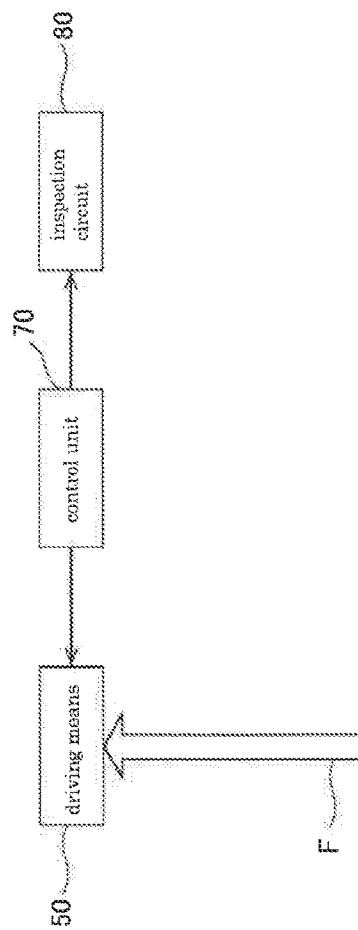
FIG. 12 is a front view illustrating the modified apparatus in which the first probe base and the second probe base are held at maximum proximity and all of the probes, both long and short types, are in contact with the sandwiched substrate in an in-circuit test mode.
Figure 12:
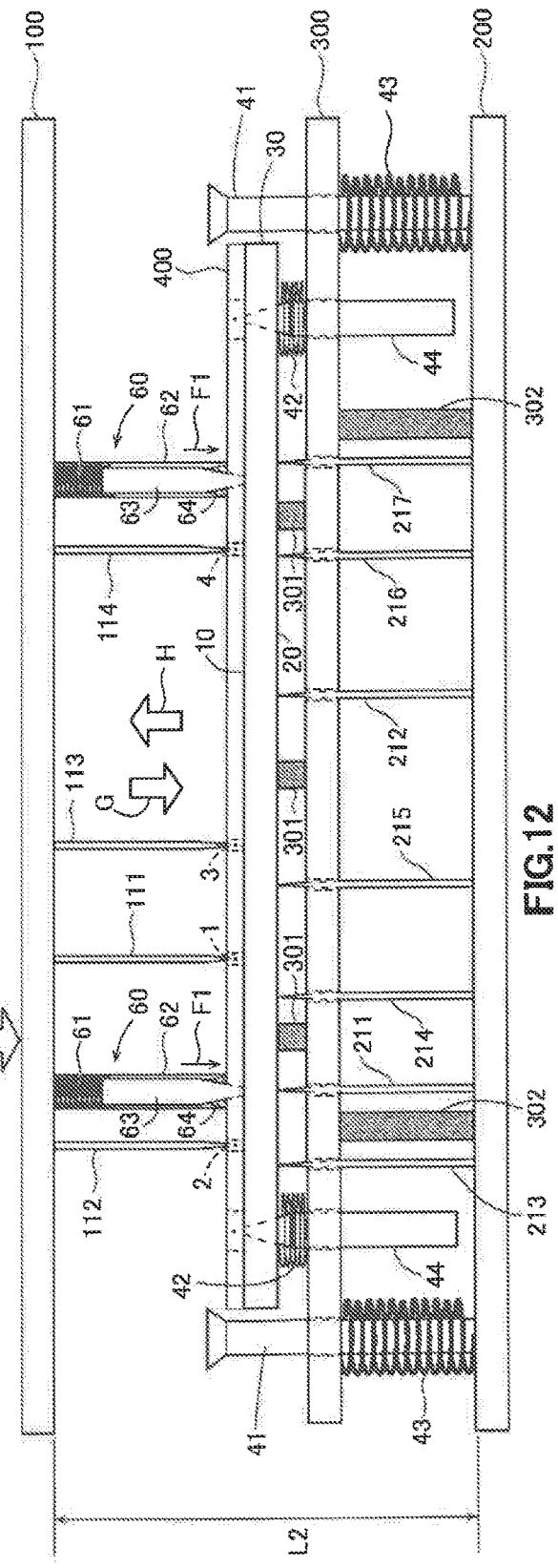
Figure 13:
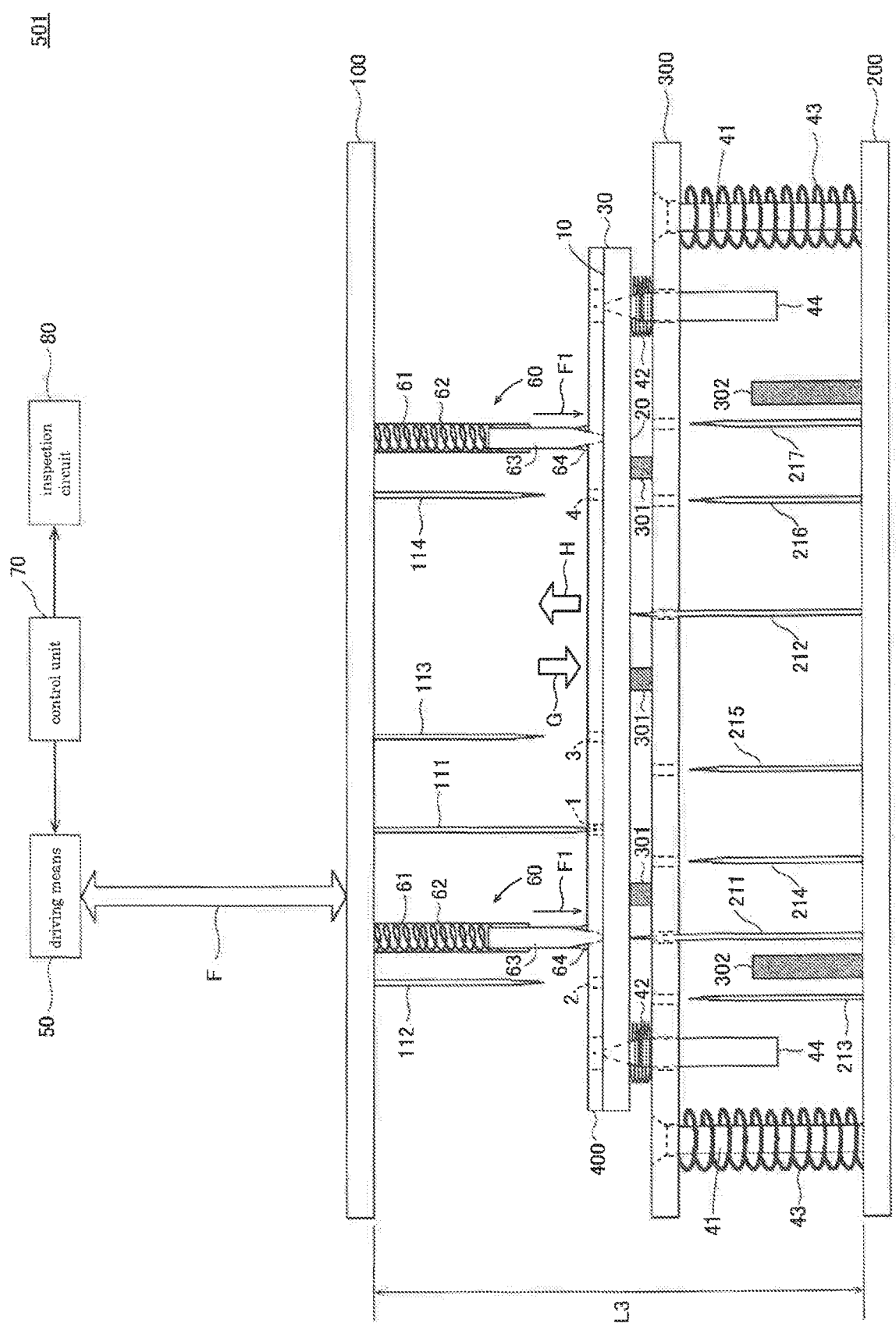
FIG. 13 is a front view illustrating the modified apparatus in which a separation distance between the first probe base and the second probe base is held at intermediate and only long probes are in contact and short probes are not in contact with the sandwiched substrate in a boundary scan test mode.

Hereinafter, a modified embodiment will be explained with reference to FIGS. 11-13. These FIGS. 11-13 correspond to FIGS. 1-3 used for explaining configuration and operation of the apparatus 500 described above. Furthermore, as compared with the apparatus 500 illustrated in with FIGS. 1-3, FIGS. 11-13 are for explaining configurations and operations which include additional members for improving safety and better functionality. It should be noted that, because operational principles are equivalent to those of the apparatus 500, redundant explanation is omitted here.

FIG. 11 is a front view illustrating a state of a modified apparatus in which a first probe base and second probe base are at maximum separation and a mounting substrate is carried on an intermediate plate positioned between the first and second probe bases.

FIG. 12 is a front view illustrating a modified apparatus in which the first probe base and the second probe base are held at maximum proximity and all of the probes, both long and short types, are in contact with a sandwiched substrate in an in-circuit test mode.

FIG. 13 is a front view illustrating a modified apparatus in which a separation distance between a first probe base and a second probe base is held at intermediate and only the long probes are in contact and the short probes are not in contact with a sandwiched substrate in a boundary scan test mode.

The modified apparatus 501 solves a problem left remaining by the apparatus 500. This problem is that locations pressed by spacers 301 and other support members not illustrated in the drawings arranged on the upper surface of the intermediate plate 300 as well the first pole 60, 90 (FIG. 10) and locations that are not pressed in the substrate 30 receive uneven bending strain so that not only does flexing occur but, in extreme cases, there is a risk of damage.

To address this problem, in contrast with the apparatus 500 pressing the substrate 30 with the first pole 60, the modified apparatus 501 is configured to press the substrate 30 using a pressing plate 400 supported by an extendable/retractable support mechanism 60 having a function equivalent to that of the first pole 60. It should be noted that, although the first pole 60 and the extendable support mechanism 60 are assigned the same reference sign due to having an equivalent function, other configurations are possible so long as having an equivalent function.

As illustrated in FIGS. 11-13, the multifunctional substrate inspection apparatus (modified apparatus) 501, in contrast with the apparatus 500 illustrated in FIGS. 1-3, is configured to further include a pressing plate 400 capable of pressing a surface of the substrate 30 under inspection elastically and evenly. This pressing plate 400 is positioned between the first probe base 100 and the substrate 30 under inspection.

Furthermore, the pressing plate 400 is secured to a tip portion of the extendable support mechanism 60 having a function equivalent to that of the first pole 60 by an adhesive agent 64 and can separate from as well as approach the first probe base 100 while maintaining parallelism therewith. It should be noted that through holes 1-4 are formed in this pressing plate 400 through which the probes 111-114 attached to the first probe base 100 can penetrate.

In many cases, vertically protruding components not illustrated in the drawings are mounted on the substrate 30. These mounted components vary among different types of substrates 30 in both arrangement and height. Accordingly, in the pressing plate 400 which faces the substrate 30, counterbore holes or through holes are opened in the pressing plate 400 which mate with and offset the height of the vertically protruding mounted components. Thus, the pressing plate 400 requires a considerable amount of machining for each type of substrate 30. With this machining, a customized pressing plate 400 is formed to be compatible for each type of substrate 30 while opening the through holes 1-4 allowing the probes 111-114 to penetrate. Thus configured, the pressing plate 400 can elastically and evenly press the surface of the substrate 30 under inspection.

It should be noted that, although the extendable support mechanism 60 of the modified apparatus 501 illustrated in FIGS. 11-13 has approximately the same configuration as that of the first pole 60 of the apparatus 500 illustrated in FIGS. 1-3, the present disclosure is not limited thereto. Thus, it is acceptable so long as the total strength of all of the springs 61 and the function of maintaining parallelism of respective plate members engaged with the spring 61 are equivalent.

Accordingly, shape of the sleeve member 62 and securing means 64 for securing the extendable support mechanism 60 with the pressing plate 400 may have a different configuration. In particular, the securing means 64, exemplified by securing with an adhesive agent, may be a commonly known screw fastener. It should be noted that through holes analogous to the through holes 1-4 are opened in the intermediate plate 300 to allow the probes 211-217 attached to the second probe base 200 to penetrate.

As described above, the modified apparatus 501 can elastically press the surface of the substrate 30 with the pressing plate 400. Furthermore, the pressing plate 400 is positioned between the first probe base 100 and the substrate 30 from which the pressing plate 400 is separable while maintaining parallelism therewith. Accordingly, the pressing plate 400 can press the substrate 30 under inspection while maintaining parallelism with the surface of the substrate 30 under inspection.

This can reduce uneven bending strain between locations that are not pressed in the substrate 30 and locations pressed by the first pole 60, 90 and by spacers 301 as well as by other support members not illustrated in the drawings arranged on the upper surface of the intermediate plate 300. Due to such action, the modified apparatus 501 has an effect of reducing the risk of flexing the flat surface of and damaging the substrate 30. Consequently, the modified apparatus 501 solves the problem left remaining by the apparatus 500.

INDUSTRIAL APPLICABILITY

The multifunctional substrate inspection apparatus and the multifunctional substrate inspection method according to the present disclosure can be employed as a multifunctional substrate inspection apparatus and multifunctional substrate inspection method performing cycles continuously while switching among two or more types of test (inspection) functions among an in-circuit test for finding individual component defects or unit-level defects in analog components mounted on a substrate under inspection, a boundary scan test for finding individual component defects or unit-level defects in digital components mounted on the substrate, and a functional test for inspecting product functioning at the substrate level, or another test.

REFERENCE SIGNS LIST

1-4 through holes, 5, 6 springs, 10 (substrate 30 upper surface) first surface, 20 second surface, 30 substrate under inspection, 31 input signal terminals, 32 output signal terminals, 41 third pole, 42 second biasing means (spring), 43 third biasing means (spring), 44 second pole, 50 driving means, 60, 90 first pole, 60 (first pole 60 equivalent) extendable support mechanism, 61 first biasing means (spring), 62, 92 sleeve member, 63 rod member, 64 securing means (adhesive agent), 93 support column, 94 tip portion, 95 cap, 96 screw portion, 97 screw, 98 contact surface, 70 control unit, 80 multifunctional inspection circuit, 100 first probe base, 111-114, 211-218 probes, 200 second probe base, 300 intermediate plate, 301, 302 spacers, 400 pressing plate, 500 multifunctional substrate inspection apparatus, 501 modified apparatus, F driving force (of driving means 50), F1 pressing force (of first pole 60), G pressing force (acting downwardly on upper surface 10 of substrate 30), H elastic force (of spring 61 and spring 42), L1-L3 separation distance (between the first probe base 100 and the second probe base 200), long probes (111, 211, 212), N normal force (received from spacer 301), S100 standby step, S200 substrate placement step, S300 substrate inspection step, S301 probe approach start step, S302 substrate descending step, (S303) first (upper side) probe group selective contact step, S304 descending substrate contact step, S305 second (lower side) probe group selective contact step, S306 first (upper side) probe group complete contact step, S307 second (lower side) probe group complete contact step, S310 in-circuit test step, S311 first (upper side) probe group selective removal step, S312 second (lower side) probe group selective removal step, S320 boundary scan test step, S330 functional test step, S400 substrate removal step

The invention claimed is:

1. A multifunctional substrate inspection apparatus configured to select probes according to switching of inspection functions and bring the selected probes into contact with a substrate to be inspected comprising:

a first probe base to which probes having different lengths and capable of being brought into contact with a first surface of the substrate to be inspected are attached;

a second probe base to which probes having different lengths and capable of being brought into contact with a second surface of the substrate to be inspected are attached;

an intermediate plate located between the first probe base and the second probe base and capable of carrying the substrate to be inspected;

driving means for generating a driving force which changes a separation distance between the first probe base and the second probe base;

a first extendable pole or equivalent extendable support mechanism attached to the first probe base and capable of pressing the first surface of the substrate to be inspected with a biasing force of the driving force transmitted via first biasing means;

second biasing means for urging the substrate to be inspected away from the intermediate plate;

a second pole regulating an operation of decreasing or increasing distance between the intermediate plate and the substrate to be inspected within a predetermined range while maintaining parallelism between facing surfaces of the intermediate plate and the substrate to be inspected;

third biasing means for urging the intermediate plate away from the second probe base;

a third pole regulating an operation of decreasing or increasing distance between the intermediate plate and the second probe base within a predetermined range while maintaining parallelism between facing surfaces of the intermediate plate and the substrate to be inspected;

a control unit causing the driving means to generate the driving force in multiple stages capable of resisting a biasing force of the second biasing means and the third biasing means; and an inspection circuit capable of switching the inspection functions in accordance with the control unit, wherein the probes are selectively brought into contact according to length.

2. The multifunctional substrate inspection apparatus according to claim 1, wherein a relation among a spring constant K1 of the first biasing means, a spring constant K2 of the second biasing means, and a spring constant K3 of the third biasing means is K2<K1<K3.

3. The multifunctional substrate inspection apparatus according to claim 2, wherein the inspection functions of the inspection circuit are any two or more of a boundary scan test, an in-circuit test, and a functional test.

4. The multifunctional substrate inspection apparatus according to claim 3, wherein the separation distance can be differentiated into three levels of maximum, minimum, and intermediate by a relation of force magnitudes between the biasing force of the second biasing means together with the third biasing means and the biasing force of the driving force together with the first extendable pole or equivalent extendable support mechanism, wherein opening the separation distance to maximum enables replacement of the substrate to be inspected, wherein closing the separation distance to minimum and bringing all of the probes into contact with the substrate to be inspected which is sandwiched corresponds with an in-circuit test function, and wherein holding the separation distance at intermediate and bringing only long probes differentiated by length into contact with the substrate to be inspected corresponds with a boundary scan test or functional test function.

5. The multifunctional substrate inspection apparatus according to claim 1, wherein the first pole has a telescoping structure in which the first biasing means interposes between a sleeve member and a rod member.

6. The multifunctional substrate inspection apparatus according to claim 1 further comprising:
a pressing plate through which through holes are opened to allow the probes attached to the first probe base to penetrate, the pressing plate being
located between the first probe base and the substrate to be inspected,
secured to a tip portion of the first pole or equivalent extendable support mechanism, and
separable from the first probe base while maintaining parallelism with the first probe base,
wherein the multifunctional substrate inspection apparatus is capable of elastically pressing the surface of the substrate to be inspected with the pressing plate.

7. A multifunctional substrate inspection method in which electrical inspection is performed while bringing probes having different lengths and capable of being brought into contact with a first surface of a substrate to be inspected attached to a first probe base and probes having different lengths and capable of being brought into contact with a second surface of the substrate to be inspected attached to a second probe base into contact with the substrate to be inspected corresponding with an inspection step comprising:
a standby step in which a control unit drives to open a separation distance between the first probe base and the second probe base to maximum via driving means and standing by;
a substrate placement step of placing the substrate to be inspected onto an intermediate plate located between the first probe base and the second probe base;
a substrate inspection step in which inspection functions of an inspection circuit are switched and sequentially performed while the control unit uses the driving means to increase and decrease the separation distance to multiple levels with a driving force resisted by a biasing force of a second biasing means urging the substrate to be inspected away from the intermediate plate and a third biasing means urging the intermediate plate away from the second probe base; and
a substrate removal step in which the control unit drives to open the separation distance to maximum via the driving means and the substrate to be inspected which has completed inspection is removed,
wherein, in the substrate inspection step, by a first extendable pole or equivalent extendable support mechanism attached to the first probe base pressing on a first surface of the substrate to be inspected via a biasing force of a first biasing means based on the driving force, the substrate to be inspected approaches the intermediate plate and the intermediate plate approaches the second probe base in a reversible stroke operation during which the probes are selectively brought into contact according to length.

8. The multifunctional substrate inspection method according to claim 7, wherein the substrate inspection step is a combination of two or more of an in-circuit test step, a boundary scan test step, and a functional test step.

9. The multifunctional substrate inspection method according to claim 8, wherein the substrate inspection step comprises:
a probe approach start step of pressing down the first probe base with the driving force of the driving means;
a substrate descending step of pressing down the substrate to be inspected with the first pole or equivalent extendable support mechanism with a biasing force of the first biasing means overcoming the second biasing means;
a first probe group selective contact step of bringing long probes of probes differentiated by being long or short of the first probe base into contact with the substrate to be inspected;
a descending substrate contact step in which the second surface of the substrate to be inspected is brought into contact with spacers of the intermediate plate;
a second probe group selective contact step of bringing long probes of probes differentiated by being long or short of the second probe base into contact with the substrate to be inspected;
a first probe group complete contact step in which the first pole or equivalent extendable support mechanism retracts to minimum length by the driving force of the driving means overcoming the biasing force of the first biasing means and all of the long and short probes of the first probe base are brought into contact with the substrate to be inspected;
a second probe group complete contact step in which the substrate to be inspected and the intermediate plate further descend due to the driving force of the driving means overcoming the biasing force of the third biasing means and all of the long and short probes of the second probe base are brought into contact with the substrate to be inspected;
the in-circuit test step;
a first probe group selective removal step of separating short probes of probes differentiated by being long or short of the first probe base from the substrate to be inspected;
a second probe group selective removal step of separating short probes of probes differentiated by being long or short of the second probe base from the substrate to be inspected;
the boundary scan test step or the functional test step which is performed with only long probes remaining after reducing a number of contacts relative to the in-circuit test step; and
a complete probe separation step of lifting the first probe base with the driving means.

10. The multifunctional substrate inspection method according to claim 7, wherein the separation distance can be differentiated into three stages of maximum, minimum, and intermediate,
wherein, in the standby step, the substrate placement step, and the substrate removal step, the separation distance is opened to maximum and the substrate to be inspected is replaceable,
wherein, in the in-circuit test step, the separation distance is closed to minimum and all of the probes are brought into contact with the substrate to be inspected which is sandwiched, and
wherein, in the boundary scan test step or the functional test step, the separation distance is held at intermediate and only the long probes are brought into contact with the substrate to be inspected.

11. The multifunctional substrate inspection method according to claim 10, wherein the first pole is elastically extendable and incorporates a first biasing means having a biasing force which extends a telescoping structure when the separation distance is at maximum or intermediate, the biasing force of the first biasing means resisting retraction of the telescoping structure when the separation distance is at minimum.

\* \* \* \* \*